(12) United States Patent
Kiyoku et al.

(10) Patent No.: US 7,154,128 B2
(45) Date of Patent: Dec. 26, 2006

(54) NITRIDE SEMICONDUCTOR GROWTH METHOD, NITRIDE SEMICONDUCTOR SUBSTRATE, AND NITRIDE SEMICONDUCTOR DEVICE

(75) Inventors: Hiroyuki Kiyoku, Anan (JP); Shuji Nakamura, Anan (JP); Tokuya Kozaki, Anan (JP); Naruhito Iwasa, Anan (JP); Kazuyuki Chocho, Anan (JP)

(73) Assignee: Nichia Chemical Industries, Limited, Tokushima-ken (JP)

( * ) Notice: Subject to any disclaimer, the term of this patent is extended or adjusted under 35 U.S.C. 154(b) by 0 days.

(21) Appl. No.: 11/052,835

(22) Filed: Feb. 9, 2005

(65) Prior Publication Data

US 2005/0202682 A1 Sep. 15, 2005

Related U.S. Application Data

(60) Division of application No. 10/600,833, filed on Jun. 23, 2003, now Pat. No. 6,940,103, which is a division of application No. 10/261,487, filed on Oct. 2, 2002, now Pat. No. 6,756,611, which is a division of application No. 09/986,332, filed on Nov. 8, 2001, now Pat. No. 7,083,679, which is a continuation of application No. 09/603,437, filed on Jun. 23, 2000, now abandoned, which is a division of application No. 09/202,141, filed as application No. PCT/JP98/01640 on Apr. 9, 1998, now Pat. No. 6,153,010.

(30) Foreign Application Priority Data

| Apr. 11, 1997 | (JP) | ................................. 9-093315 |
| Jun. 30, 1997 | (JP) | ................................. 9-174494 |
| Jul. 7, 1997 | (JP) | ................................. 9-181071 |
| Jul. 28, 1997 | (JP) | ................................. 9-201477 |
| Oct. 22, 1997 | (JP) | ................................. 9-290098 |
| Nov. 26, 1997 | (JP) | ................................. 9-324997 |
| Oct. 9, 1907 | (JP) | ................................. 9-277448 |

(51) Int. Cl.
*H01L 21/205* (2006.01)

(52) U.S. Cl. .......................... 257/103; 257/78; 117/95

(58) Field of Classification Search .................. 257/76, 257/78, 98–103, 200, 201; 117/97, 106, 117/952

See application file for complete search history.

(56) References Cited

U.S. PATENT DOCUMENTS 4,127,792 A 11/1978 Nakata (Continued)

FOREIGN PATENT DOCUMENTS

EP 0 551 721 A2 7/1993

(Continued)

OTHER PUBLICATIONS

Zheleva et al., *Dislocation Density Reduction Via Lateral Epitaxy in Selectively Grown GaN Structures*, Appl. Phys, Lett. vol. 71, No. 17, Oct. 27, 1997, pp. 2472-2474.

(Continued)

*Primary Examiner*—Thomas L. Dickey
(74) *Attorney, Agent, or Firm*—Sughrue Mion, PLLC

(57) ABSTRACT

A method of growing a nitride semiconductor crystal which has very few crystal defects and can be used as a substrate is disclosed. This invention includes the step of forming a first selective growth mask on a support member including a dissimilar substrate having a major surface and made of a material different from a nitride semiconductor, the first selective growth mask having a plurality of first windows for selectively exposing the upper surface of the support member, and the step of growing nitride semiconductor portions from the upper surface, of the support member, which is exposed from the windows, by using a gaseous Group 3 element source and a gaseous nitrogen source, until the nitride semiconductor portions grown in the adjacent windows combine with each other on the upper surface of the selective growth mask.

21 Claims, 8 Drawing Sheets

U.S. PATENT DOCUMENTS

| | | | |
|---|---|---|---|
| 4,482,422 A | 11/1984 | McGinn et al. | |
| 4,522,661 A | 6/1985 | Morrison et al. | |
| 4,578,142 A | 3/1986 | Corboy et al. | |
| 4,651,407 A | 3/1987 | Bencuya | |
| 4,865,685 A | 9/1989 | Palmour | |
| 4,876,210 A | 10/1989 | Barnett et al. | |
| 4,908,074 A | 3/1990 | Hosoi et al. | |
| 4,912,064 A | 3/1990 | Kong et al. | |
| 4,946,547 A | 8/1990 | Palmour et al. | |
| 5,122,845 A | 6/1992 | Manabe et al. | |
| 5,239,188 A | 8/1993 | Takeuchi et al. | |
| 5,247,533 A | 9/1993 | Okazaki et al. | |
| 5,290,393 A | 3/1994 | Nakamura | |
| 5,364,815 A | 11/1994 | Osada | |
| RE34,861 E | 2/1995 | Davis et al. | |
| 5,389,571 A | 2/1995 | Takeuchi et al. | |
| 5,397,736 A | 3/1995 | Bauser et al. | |
| 5,523,589 A | 6/1996 | Edmond et al. | |
| 5,549,747 A | 8/1996 | Bozler et al. | |
| 5,620,557 A * | 4/1997 | Manabe et al. | 438/507 |
| 5,633,192 A * | 5/1997 | Moustakas et al. | 438/46 |
| 5,679,152 A | 10/1997 | Tischler et al. | |
| 5,709,745 A | 1/1998 | Larkin et al. | |
| 5,710,057 A | 1/1998 | Kenney | |
| 5,714,006 A | 2/1998 | Kizuki et al. | |
| 5,727,008 A | 3/1998 | Koga et al. | |
| 5,760,426 A | 6/1998 | Marx et al. | |
| 5,764,673 A | 6/1998 | Kawazu et al. | |
| 5,766,695 A | 6/1998 | Nguyen et al. | |
| 5,770,887 A * | 6/1998 | Tadatomo et al. | 257/613 |
| 5,773,369 A | 6/1998 | Hu et al. | |
| 5,786,606 A | 7/1998 | Nishio et al. | |
| 5,789,265 A | 8/1998 | Nitta et al. | |
| 5,815,520 A | 9/1998 | Furushima | |
| 5,838,029 A | 11/1998 | Shakuda | |
| 5,877,070 A | 3/1999 | Goesele et al. | |
| 5,880,485 A | 3/1999 | Marx et al. | |
| 6,051,849 A | 4/2000 | Davis et al. | |
| 6,153,010 A | 11/2000 | Kiyoku et al. | |
| 6,294,440 B1 | 9/2001 | Tsuda et al. | |
| 6,362,515 B1 | 3/2002 | Hayakawa | |
| 6,462,355 B1 | 10/2002 | Linthicum et al. | |
| 6,545,300 B1 | 4/2003 | Gehrke et al. | |
| 2001/0007242 A1 | 7/2001 | Davis et al. | |
| 2001/0009167 A1 | 7/2001 | Davis et al. | |
| 2001/0038655 A1 | 11/2001 | Tanaka et al. | |

FOREIGN PATENT DOCUMENTS

| | | |
|---|---|---|
| EP | 0 852 416 A1 | 7/1998 |
| JP | 5-55631 A | 3/1993 |
| JP | 5-343741 A | 12/1993 |
| JP | 7-165498 | 6/1995 |
| JP | 7-201745 A | 8/1995 |
| JP | 7-202265 | 8/1995 |
| JP | 8-64791 A | 3/1996 |
| JP | 8-116090 A | 5/1996 |
| JP | 7-273367 A | 10/1999 |
| WO | WO 97/11518 | 3/1997 |
| WO | WO 97/11518 A1 | 3/1997 |
| WO | WO 99/44224 | 9/1999 |

OTHER PUBLICATIONS

Doverspike et al., *The Effect of GaN and AlN Buffer Layers on GaN Film Properties Grown on Both C-Plane and A-Plane Sapphire*, Journal of Electronic Materials, vol. 24, No. 4, 1995, pp. 269-273.

Kuznia et al., *Influence of Buffer Layers on the Deposition of High Quality Single Crystal GaN Over Sapphire Substrates*, J. Appl. Phys., vol. 73, No. 9, May 1, 1993 pp. 4700-4702.

Watanabe et al., *The Growth of Single Crystalline GaN on a Si Substrate Using AlN As An Intermediate Layer*, Journal of Crystal Growth, vol. 128, 1993, pp. 391-396.

Chen et al., *Silicon-on-Insulator: Why, How, and When*, AIP Conference Proceedings, vol. 167, No. 1, Sep. 15, 1988, pp. 310-319.

Amano et al., *Metalorganic Vapor Phase Epitaxial Growth of a High Quality GaN Film Using an AlN Buffer Layer*, Applied Physics Letters, vol. 48, No. 5, Feb. 3, 1986, pp. 353-355.

Lester et al, "High Dislocation Densities in High Efficiency GaN-Based Light-Emitting Diodes", *Appl. Phys. Lett.*, 66, 1995, pp. 1249-1251.

Nakamura, Shuji and Gerhard Fasol, *The Blue Laser Diode: GaN Based Light Emitters and Lasers*, Berlin: Springer 1997, pp. 282-304.

International Search Report, PCT/US99/04346, Jun. 9, 1999.

Defendant Nichia America Corporation's Motion for Partial Summary Judgment, *North Carolina State University and Cree, Inc.*, v. *Nichia Corporation and Nichia America Corporation*, No.: 5:00-CV-703-F(2), U.S. District Court for the Eastern District of North Carolina Southern Division, Dec. 11, 2000.

International Search Report, PCT/US98/01640, Jul. 14, 1998.

Yoshida et al., *Improvements on the Electrical and Luminescent Properties of Reactive Molecular Beam Epitaxially Grown GaN Films by Using AlN-Coated Sapphire Substrates*, Applied Physics Letters, vol. 42, No. 5, Mar. 1, 1983, pp. 427-429.

Nakamura, *GaN Growth Using GaN Buffer Layer*, Japanese Journal of Applied Physics, vol. 30, No. 10A, Oct. 1991, pp. L1705-L1707.

International Search Report, PCT/US99/12967, Oct. 18, 1999.

Kapolnek et al., "*Anisotropic Epitaxial Lateral Growth in GaN Selective Area Epitaxy*", Appl. Phys. Lett. 71(9), Sep. 1, 1997, pp. 1204-1206.

Usui et al., "*Thick GaN Epitaxial Growth With Low Dislocation Density by Hydride Vapor Phase Epitaxy*", Jpn. J. Appl. Phys., vol. 36, Part 2, No. 7B, Jul. 15, 1997, pp. 899-902.

Nam et al., "*Growth of GaN and $Al_{0.2}Ga_{0.8}N$ on Patterned Substrates Via Organometallic Vapor Phase Epitaxy*", Jpn. J. Appl. Phys., vol. 36, Part 2, No. 5A, May 1, 1997, pp. 532-535.

Nam et al., "*Selective Growth of GaN and $Al_{0.2}Ga_{0.8}N$ on GaN/AlN/6H-SiC(0001) Multilayer Substrates Via Organometallic Vapor Phase Epitaxy*", Proceedings MRS, Dec. 1996, 6 pp.

Kapolnek et al., "*Selective Area Epitaxy of GaN for Electron Field Emission Devices*," Journal of Crystal Growth, 5451, 1996, pp. 1-4.

Weeks et al, "*GaN Thin Films Deposited Via Organometallic Vapor Phase Epitaxy on a(6H)SiC(001) Using High-Temperature Monocrystalline AlN Buffer Layers*", Appl. Phys. Lett. 67(3), Jul. 17, 1995, pp. 401-403.

Kato et al., "*Selective Growth of Wurtzite GaN and $Al_xGa_{1-x}N$ on GaN/Sapphire Substrates by Metalorganic Vapor Phase Epitaxy*", Journal of Crystal Growth, 144, 1994, pp. 133-140.

Yamaguchi et al., "*Lateral Supply Mechanisms in Selective Metalorganic Chemical Vapor Deposition*", Jpn. Appl. Phys., vol. 32 (1993), pp. 1523-1527.

Nakamura et al., *InGaN/GaN/AlGaN-Based Laser Diodes With Modulatino-Doped Strained-Layer Superlatices*, Jpn. J. Appl. Phys., vol. 36, Dec. 1, 1997, pp. L1568-L1571.

Linthicum et al., *Pendeopitaxy of Gallium Nitride Thin Films*, Applied Physics Letters, vol. 75, No. 2, Jul. 12, 1999, pp. 196-198.

Zheleva et al., *Pendeo-Epitaxy: A New Appraoch for Lateral Growth of Gallium Nitride Films*, Journal of Electronic Materials, vol. 28, No. 4, Feb. 1999, pp. L5-L8.

Zheleva et al., *Pendeo-Epitaxy-A New Appraoch for Lateral Growth of GaN Structures*, MRS Internet Journal of Nitride Semiconductor Research, 1999, Online!, vol. 4S1, No. G3.38, Nov. 30, 1998-Dec. 4, 1998.

Nakamura et al., *InGaN/GaN/AlGaN-Based Laser Diodes Grown on GaN Substrates With a Fundamental Transverse Mode*, Jpn. J. Appl. Phys., vol. 37, Sep. 15, 1998, pp. L1020-L1022.

Marchand et al., *Microstructure of GaN Laterally Overgrown by Metalorganic Chemical Vapor Deposition*, Applied Physics Letters, vol. 73, No. 6, Aug. 10, 1998, pp. 747-749.

Sakai et al., *Transmission Electron Microscopy of Defects in GaN films Formed by Epitaxial Lateral Overgrowth*, vol. 73, No. 45, Jul. 27, 1998, pp. 481-483.

Nakamura et al., *High-Power, Long-Lifetime InGaN/GaN/AlGaN-Based Laser Diodes Grown on Pure GaN Substrates*, Jpn. J. Appl. Phys., vol. 37, Mar. 15, 1998, pp. L309-312.

Nam et al., *Lateral Epitaxial Overgrowth of GaN Films on $SiO_2$ Areas Via Metalorganic Vapor Phase Epitaxy*, Journal of Electronic Materials, vol. 27, No. 4, 1998, pp. 233-237.

Wu et al., *Growth and Characterization of SiC Films on large-Area Si Wafers by APCVD-Temperature Dependence*, Materials Science Forum, vols. 264-268, 1998, pp. 179-182.

Nam et al., *Lateral Epitaxy of Low Defect Density GaN Layers Via Organometallic Vapor Phase Epitaxy*, Appl. Phys. Lett., vol. 71, No. 18, Nov. 3, 1997, pp. 2638-2640.

Porowski, S., "High pressure growth GaN—new prospects for blue lasers," Journal of Crystal Growth, pp. 583-589, 166(1999), Polish Academy of Sciences, Warsaw, Poland.

\* cited by examiner

NITRIDE SEMICONDUCTOR GROWTH METHOD, NITRIDE SEMICONDUCTOR SUBSTRATE, AND NITRIDE SEMICONDUCTOR DEVICE

This is a divisional of application Ser No. 10/600,833 filed Jun. 23, 2003 now U.S. Pat. No. 6,940,103, which is a divisional of application Ser No. 10/261,487 filed Oct. 2, 2002 now U.S. Pat. No. 6,756,611, which is a divisional of application Ser No. 09/986,332 filed Nov. 8, 2001 now U.S. Pat. No. 7,083,679, which is a Continuation of application Ser. No. 09/603,437 filed Jun. 23, 2000, now abandoned, which is a divisional of application Ser. No. 09/202,141 filed Dec. 9, 1998, now U.S. Pat. No. 6,153,010, which is the National stage entry of PCT/JP98/01640 filed Apr. 9, 1998. The above-noted applications incorporated herein by reference in their entirety.

TECHNICAL FIELD

The present invention relates to a nitride semiconductor growth method, a nitride semiconductor substrate, and a nitride semiconductor device and, more particularly, to a method of growing a nitride semiconductor having good crystal quality by using a substrate made of a material different from a nitride semiconductor, a nitride semiconductor substrate, and a nitride semiconductor device.

BACKGROUND ART

It is generally known that a semiconductor having few crystal defects and good crystallinity is grown on a substrate by using a substrate lattice-matched with the semiconductor to be grown. There is, however, no substrate that is lattice-matched with a nitride semiconductor, has excellent crystallinity, and allows a nitride semiconductor crystal to be stably grown. For this reason, there is no choice but to grow a nitride semiconductor on a substrate, e.g., a sapphire, spinner, or silicon carbide substrate, that is not lattice-matched with nitride semiconductors.

Various research institutes have made attempts to manufacture GaN bulk crystals that are lattice-matched with nitride semiconductors. However, it has only been reported that GaN bulk crystals having sizes of several millimeters are obtained. That is, any practical GaN bulk crystal like the one from which many wafers are cut to be actually used as substrates for the growth of nitride semiconductor layers has not been obtained.

As a technique of manufacturing GaN substrates, for example, Jpn. Pat. Appln. KOKAI Publication Nos. 7-202265 and 7-165498 disclose a technique of forming a ZnO buffer layer on a sapphire substrate, growing a nitride semiconductor on the ZnO buffer layer, and dissolving and removing the ZnO buffer layer. However, since the ZnO buffer layer grown on the sapphire substrate has poor crystallinity, it is difficult to obtain a nitride semiconductor crystal having good quality by growing a nitride semiconductor on the buffer layer. In addition, it is difficult to continuously grow a nitride semiconductor thick enough to be used as a substrate on the thin ZnO buffer layer.

When a nitride semiconductor electronic element used for various electronic devices such as a light-emitting diode (LED) device, a laser diode (LD) device, and a light-receiving device is to be manufactured, if a substrate made of a nitride semiconductor having few crystal defects can be manufactured, a new nitride semiconductor having few lattice defects and forming a device structure can be grown on the substrate. Therefore, the obtained device acquires greatly improved performance. That is, a high-performance device that has not been realized in the past can be realized.

It is, therefore, an object of the present invention to provide a method of growing a nitride semiconductor crystal having excellent crystallinity.

More specifically, it is an object of the present invention to provide a method of growing a nitride semiconductor crystal that can provide a nitride semiconductor substrate, a nitride semiconductor substrate, and a nitride semiconductor device formed on the nitride semiconductor substrate.

DISCLOSURE OF INVENTION

According to a first aspect of the present invention, there is provided a nitride semiconductor growth method comprising the steps of (a) forming a first selective growth mask on a support member made up of a dissimilar substrate made of a material different from a nitride semiconductor and having a major surface, and an underlayer made of a nitride semiconductor formed on the major surface of the dissimilar substrate, the first selective growth mask having a plurality of first windows selectively exposing an upper surface of the underlayer of the support member, and (b) growing nitride semiconductor portions from the upper surface portions, of the underlayer, which are exposed from the windows, by using a gaseous Group 3 element source and a gaseous nitrogen source, until the nitride semiconductor portions grown in the adjacent windows combine or unite with each other on an upper surface of the selective growth mask. In this case, the total area of upper surfaces of portions, of the underlayer, which are covered with the first selective growth mask is preferably larger than that of portions, of the underlayer, which are exposed from the first windows.

According to a second aspect of the present invention, there is provided a nitride semiconductor growth method comprising the steps of (a) forming a first selective growth mask on a support member comprising a dissimilar substrate made of a material different from a nitride semiconductor and having a major surface, the first selective growth mask having a plurality of first windows for partly exposing an upper surface of the support member, such that a total area of upper surfaces of portions, of the support member, which are covered with the first selective growth mask is larger than that of portions, of the support member, which are exposed from the first windows, and (b) growing first nitride semiconductor portions from the upper surface portions, of the support member, which are exposed from the windows, by using a gaseous Group 3 element source and a gaseous nitrogen source, until the nitride semiconductor portions grown in the adjacent windows combine or unite with each other on an upper surface of the selective growth mask.

In the first and second aspects if the present invention, the first selective growth mask is preferably made up of a plurality of individual or discrete stripes spaced apart from each other, defining the first windows there between, and extending parallel to each other. In addition, in the first and second aspects, the ratio of a width of each of the stripes to a width of each of the first windows is preferably more than 1 and not more than 20. In the first and second aspects, it is especially preferable that the dissimilar substrate be a sapphire substrate having a major surface forming a (0001) plane, and the respective stripes preferably extend in a direction perpendicular to a (11$\bar{2}$0) plane of sapphire; the dissimilar substrate be a sapphire having a major surface forming a (11$\bar{2}$0) plane, and the respective stripes extend in a direction perpendicular to the (1$\bar{1}$02) plane of sapphire; or the dissimilar substrate be a spinnel substrate having a major surface forming a (111) plane, and the respective stripes extend in a direction perpendicular to the (110) plane of spinnel.

Furthermore, in the first and second aspects, growth of the first nitride semiconductor crystal in the step (b) can be performed by metalorganic vapor-phase epitaxy, and a second nitride semiconductor crystal can be grown, on the grown first nitride semiconductor crystal, by a halide vapor-phase epitaxial growth method. Alternatively, the first and second aspects can further comprise the step (c) of forming a second selective growth mask on the first nitride semiconductor grown in the step (b), the second selective growth mask having a plurality of second windows selectively exposing an upper surface of the first nitride semiconductor, and the step (d) of growing second nitride semiconductor portions from the upper surface portions, of the first nitride semiconductor, which are exposed from the second windows, by using a gaseous Group 3 element source and a gaseous nitrogen source, until the second nitride semiconductor portions grown in the adjacent windows combine or unite with each other on an upper surface of the second selective growth mask. In this case, the second selective growth mask preferably has the same arrangement or construction as that of the first selective growth mask.

According to a third aspect of the present invention, there is provided a nitride semiconductor growth method comprising the steps of (a) forming a nitride semiconductor layer on a support member comprising a dissimilar substrate made of a material different from a nitride semiconductor and having a major surface, (b) forming a plurality of recess portions having bottom surfaces substantially parallel to an upper surface of the support member in the nitride semiconductor layer, (c) selectively forming a first growth control mask on a top surface of the nitride semiconductor layer to selectively expose the nitride semiconductor layer from side surfaces of the recess portions, and (d) growing a nitride semiconductor from an exposed surface of the nitride semiconductor layer by using a gaseous Group 3 element source and a gaseous nitrogen source. In this case, the first growth control mask preferably has the same arrangement or construction as that of the first selective growth mask in the first and second aspects.

In the third aspect, it is especially preferable that the step (c) further comprise forming a second growth control mask on the bottom surfaces of the recess portions to selectively expose the nitride semiconductor layer from side surfaces of the recess portions. In this case, the first growth control mask is preferably made up of a plurality of individual or discrete stripes spaced apart from each other, defining the first windows therebetween, and extending parallel to each other. In addition, it is especially preferable that dissimilar substrate be a sapphire substrate having a major surface forming a (0001) plane, and the respective individual stripes extend in a direction perpendicular to a (11$\bar{2}$0) plane of sapphire; the dissimilar substrate be a sapphire substrate having a major surface forming a (11$\bar{2}$0) plane, and the respective individual stripes extend in a direction perpendicular to the (1$\bar{1}$20) plane of sapphire; or the dissimilar substrate be a spinnel substrate having a major surface forming a (111) plane, and the respective stripes extend in a direction perpendicular to the (110) plane of spinnel.

In growing a nitride semiconductor crystal according to the present invention, the gaseous nitrogen source and the gaseous Group III element source are preferably supplied at a molar ratio of not more than 2,000.

In addition, according to the present invention, there is provided a nitride semiconductor substrate comprising a nitride semiconductor crystal and having first and second major surfaces, wherein a region near the first major surface has a relatively small number of crystal defects, and a region near the second major surface has a relatively large number of crystal defects. There is also provided a nitride semiconductor substrate comprising a nitride semiconductor crystal and having first and second major surfaces, characterized by the number of crystal defects in a surface region in the first major surface being not more than $1 \times 10^5$ cm$^2$.

Furthermore, according to the present invention, there is provided a nitride semiconductor device comprising a nitride semiconductor device structure supported on the nitride semiconductor substrate of the present invention.

Further developments of the present invention are described in the following description and the appended claims.

In the present invention, a nitride semiconductor can be represented by the formula, $In_aAl_yGa_{1-a-b}N$ (wherein $0 \leq a$, $0 \leq b$, and $a+b \leq 1$).

BEST MODE OF CARRYING OUT THE INVENTION

Figure 1A:
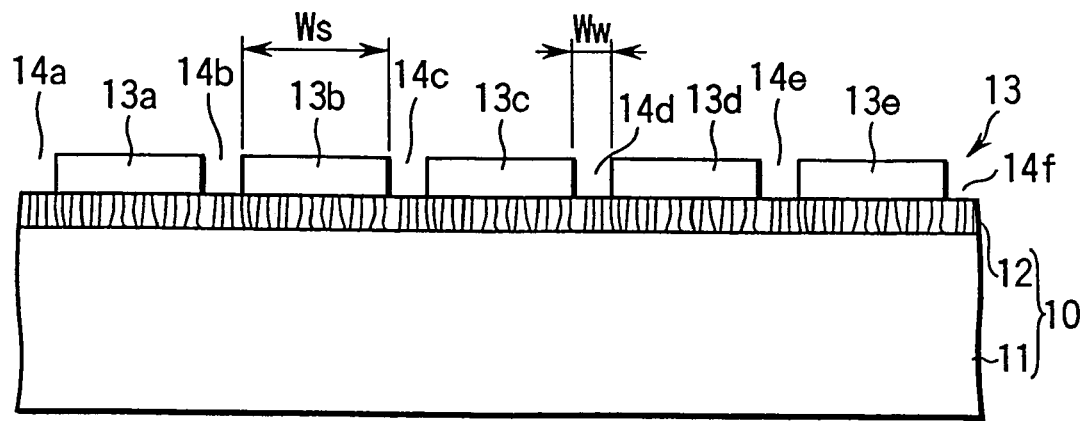
FIGS. 1A to 1C are schematic sectional views for explaining the principle of a nitride semiconductor growth method according to the first or second aspect of the present invention in the order of the steps.

The present invention will be described below with reference to the accompanying drawings. The same or similar parts are denoted by the same reference numerals throughout the drawings.

Figure 1B:
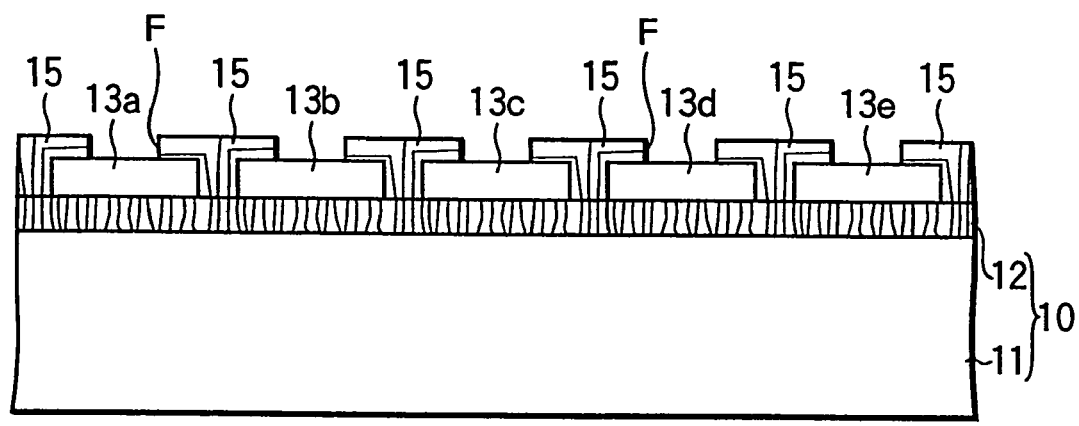
Figure 1C:
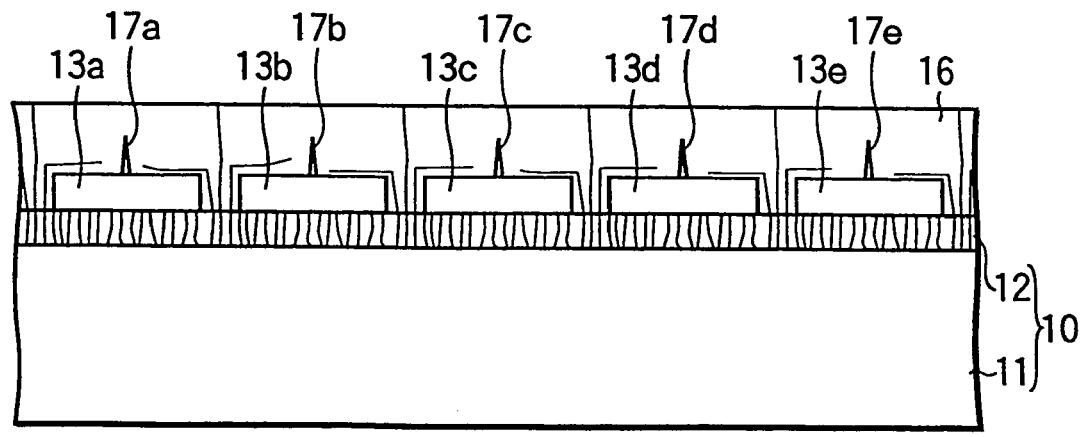

FIGS. 1A to 1C are sectional views for explaining the principle of a nitride semiconductor growth method according to the first aspect of the present invention in the order of the steps.

As shown in FIG. 1A, first of all, a support member 10 made up of a substrate (to be sometimes referred to as "dissimilar substrate" hereinafter) made of a material different from a nitride semiconductor and an underlayer 12 made of a nitride semiconductor formed on the substrate 11 is prepared.

In the specification and the claims, the "underlayer" means a layer made of a nitride semiconductor grown not by the growth method of the present invention but by a general nitride semiconductor growth method. This underlayer 12 may be of a single-layer structure or a multilayer structure. FIG. 1A shows the underlayer 12 as a buffer layer of a single-layer structure. Such a buffer layer eases or alleviates the lattice mismatch between the dissimilar substrate 11 and a nitride semiconductor crystal grown on the underlayer 12 to allow a nitride semiconductor crystal having better crystallinity to grow thereon. In general, this crystal is grown to several ten angstroms to several hundred angstroms at a low temperature less than 900° C., usually 500° C. to 800° C. It is especially preferable that such a low-temperature buffer layer be made of undoped GaN doped with no impurity. In the present invention, if the underlayer is formed to have a multilayer structure, a nitride semiconductor crystal having lesser crystal defects can be formed on the underlayer. In the present invention, for example, an underlayer of a multilayer structure can be made of a low-temperature buffer layer like the one described above, which is formed on the dissimilar substrate 11, and another nitride semiconductor layer formed thereon. It is especially preferable that this another nitride semiconductor layer be made of $Al_xGa_{1-x}N$ ($0 \leq x \leq 0.5$). The another nitride semiconductor layer is formed to have a thickness larger than that of the low-temperature buffer layer, preferably 10 µm or less. The underlayer 12 can be grown by any of the known methods suitable for the growth of a nitride semiconductor, e.g., the metalorganic vapor-phase epitaxial method (MOVPE), the molecular beam epitaxial method (MBE), and the halide vapor-phase epitaxial growth method (HVPE), by using a gaseous Group 3 element source and a gaseous nitrogen source.

Referring to FIG. 1A again, a selective growth mask 13 having a plurality of windows 14a to 14e partly (selectively) exposing the underlayer formed on the underlayer 12 formed on the dissimilar substrate 11. FIG 1A shows, as a preferred form, the selective growth mask 13 as being made up of individual or discrete strips 13a to 13e each having a rectangular cross-section. Referring to FIG. 1A, the spaces between the stripes 13 correspond to the windows 14a to 14e. The windows 14a to 14e will be sometimes generically referred to simply as a window 14 hereinafter.

As shown in FIG. 1B, nitride semiconductor portions 15 are grown from the surface portions, of the underlayer 12, which are exposed from the windows 14a to 14e of the selective growth mask 13 by using a gaseous Group 3 element source and a gaseous nitrogen source according to the present invention. When nitride semiconductor portions are grown on the underlayer 12 whose surface is selectively covered with the selective growth mask 13 (or selectively exposed) in this manner, the nitride semiconductor portions do not grow on the entire surface of the selective growth mask 13 at first, but selectively grow on the portions, of the underlayer 12, which are exposed by the windows 14. When the nitride semiconductor portions further grow and exceed the upper end faces of the mask 13, each nitride semiconductor crystal 15 exceeds a corresponding window 14 and then grows laterally on a corresponding selective growth mask 13. Since the crystal defects in the underlayer 12 are covered with the selective growth mask 13, the crystal defects are not easily dislocated to the portion, of the nitride semiconductor 15, which grows laterally unlike a nitride semiconductor growing vertically like the underlayer 12. In addition, the crystal defects of the underlayer 12 extend laterally as the nitride semiconductor crystal 15 grows on the selective growth mask 13, but tends to stop halfway. Furthermore, some crystal defects dislocated through the window 14 appear on the upper surface of the nitride semiconductor layer, but the crystal defects tend to stop halfway.

When the nitride semiconductor portions for the nitride semiconductor crystals 15 keep growing in this manner, the adjacent nitride semiconductor crystals 15 that grow laterally and vertically on the selective growth mask 13 are joined to each other. Finally, as shown in FIG. 1C, all the crystals 15 combine into an integral nitride semiconductor crystal 16. Narrow, small cavities 17a to 17e, each located in substantially the middle of the upper surface of a corresponding one of the stripe masks 13a to 13e, having a triangular cross-section, and extending in the longitudinal direction of each of the stripes 13a to 13e, prove that the adjacent nitride semiconductor crystals 15 grow laterally on the selective growth mask 13 and then grow vertically to combine with each other (in FIGS. 1A to 1C, the wavy lines and the bent lines on the underlayer 12, the nitride semiconductor portions crystals 15, and the nitride semiconductor crystal 16 indicate crystal defects (penetrating dislocations); the same applies to FIGS. 5A and 6A to 6C).

More specifically, relatively many crystal defects are generated in the underlayer 12 grown on the different type of substrate 11 or portions of the initially grown nitride semiconductor crystals 15 due to the lattice mismatch between the dissimilar substrate 11 and the nitride semiconductor portions. During the growth of the nitride semiconductor portions 15, these crystal defects can be transferred to the leading or front surfaces of the grown crystals. The nitride semiconductor crystal 16 formed on the selective growth mask 13 is not grown from the substrate 11 or the underlayer 12 but is formed such that the nitride semiconductor crystals 15 grow laterally, and the adjacent nitride semiconductor crystals 15 finally combine with each other. Therefore, the number of crystal defects in the nitride semiconductor crystal 16 formed on the selective growth mask 13 is much smaller than that in the crystals directly grown from the dissimilar type of substrate 11 or the nitride semiconductor crystal portions initially grown from the underlayer 12 into the windows 14a to 14f. By using this combined nitride semiconductor crystal 16 as a growth substrate for various nitride semiconductor layers constituting a device structure, a nitride semiconductor device having crystallinity superior to that of a conventional device and hence having excellent performance can be realized.

The principle of a nitride semiconductor growth method according to the second aspect of the present invention will be described next with reference to FIGS. 1A to 1C. In the nitride semiconductor growth method according to the second aspect, a selective growth mask 13 is formed such that the total area of the upper surfaces of the portions, of a support member 10, which are covered with the selective growth mask 13 is larger than the total area of the upper surfaces of the portions, of the support member 10, which are exposed through windows 14a to 14f. A nitride semiconductor crystal 16 having fewer crystal defects can be obtained by setting the total area of the upper surfaces of the portions, of the support member 10, which are covered with the selective growth mask 13 to be larger than the total area of the upper surfaces of the portions, of the support member 10, which are exposed through windows 14. In the second aspect, the combined nitride semiconductor crystal 16 can be grown by the same method as in the first aspect except for the use of the selective growth mask 13 having this relationship between the total area of the covered surfaces and the total area of the exposed surfaces (see the above description about the first aspect, made with respect to FIGS. 1A to 1C).

In the second aspect, an underlayer 12 is preferably present for the above reason described concerning the first aspect, but can be omitted. That is, in the specification and the claims, a support member can be made of only a dissimilar substrate 11, or of the dissimilar substrate 11 and the underlayer 12 formed thereon.

Obviously, in the first aspect as well, the selective growth mask 13 is preferably formed such that the total area of the upper surfaces, of the support member 10, which are covered with the selective growth mask 13 is larger than the total area of the upper surfaces, of the support member 10, which are exposed through the windows 14a to 14f.

Preferable conditions for the nitride semiconductor growth method according to the present invention will be described next.

<Dissimilar Substrate>

As described above, the dissimilar substrate 11 is not specifically limited as long as it is made of a material different from a nitride semiconductor. For example, a substrate made of a material different from a nitride semiconductor such as an insulating substrate like a sapphire having the C plane ((0001) plane), the R plane ((1$\bar{1}$02) plane), or the A plane ((11$\bar{2}$0) plane) as a major surface or spinnel (MgAl$_2$O$_4$), an SiC (including 6H, 4H, and 3C), a ZnS substrate, a GaAs substrate, or an Si substrate, can be used. Note that an oxide substrate (e.g., a ZnO substrate or La$_x$Sr$_{1-x}$Al$_y$Ta$_{1-y}$O$_3$ substrate) that can ensure lattice match with a nitride semiconductor may be used, although it tends to decompose during the growth of the nitride semiconductor. The dissimilar substrate can have a major surface size of a diameter of 1 inch or 1 inch square or more, and preferably has a major surface size of a diameter of on 1 inch or 1 inch square to a diameter of 3 inches or 3 inches square. The nitride semiconductor crystal grown by the present invention can have a surface size almost equal to that of this dissimilar substrate.

Figure 2:
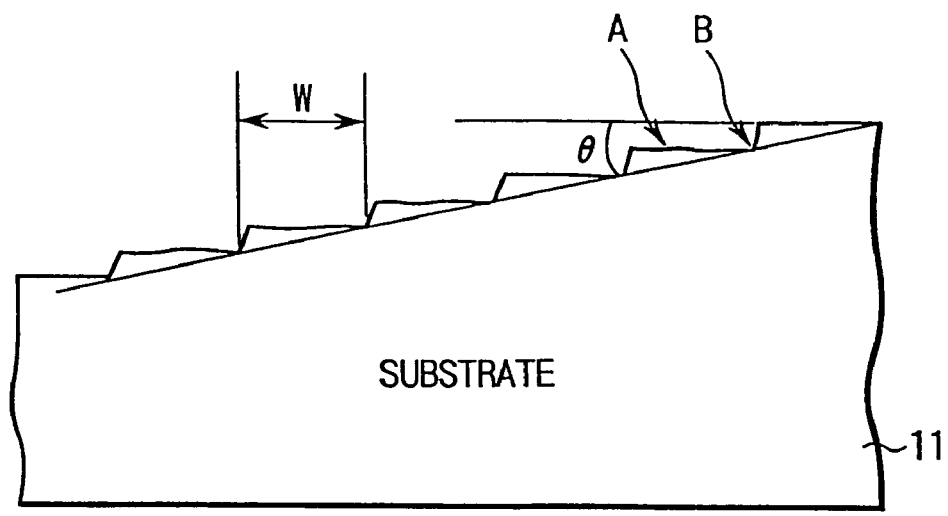
FIG. 2 is a schematic sectional view showing a substrate which has an off-angled major surface and can be used to grow a nitride semiconductor layer in accordance with the present invention.

As the dissimilar substrate 11, a substrate having a major surface off-angled from the horizontal plane, preferably a major surface off-angled stepwise, can be used. Such a substrate will be described in detail with reference to, for example, FIG. 2 showing an enlarged view of a sapphire substrate 11 having a major surface off-angled stepwise. This substrate 11 has substantially horizontal terrace portions A and stepped portions B. The terrace portions A are regularly formed while the average size of uneven portions on the surface of each terrace portion A is adjusted to about 0.5 angstroms, and the maximum size is adjusted to about 2 angstroms. The size of each stepped portion B is preferably 30 angstroms or less, more preferably 25 angstroms or less, and most preferably 20 angstroms or less. The lower limit of the size of each stepped portion B is preferably 2 angstroms or more. Stepped portions each having such an off angle θ are preferably formed continuously on the entire surface of the dissimilar substrate 11, but may be partly formed. As shown in FIG. 2, the off angle θ of the major surface off-angled stepwise is the angle defined by a straight line connecting the bottom portions of a plurality of stepped portions and the horizontal plane of the terrace portion on the uppermost layer. When a sapphire substrate having a C plane as a major surface is used as the dissimilar substrate 11, the off angle θ with respect to the C plane is 1 or less, preferably 0.8 or less, and more preferably 0.6 or less. With the use of a dissimilar substrate having a major surface off-angle in this manner, the interatomic distance between the nitride semiconductor to be grown according to the present invention and the dissimilar substrate decreases, thereby obtaining a nitride semiconductor substrate having few crystal defects.

<Selective Growth Mask>

The selective growth mask 13 does not substantially grow any nitride on its surface. This selective growth mask 13 is made of a material having the property of not growing any nitride semiconductor on its surface or making the growth of any nitride semiconductor on its surface difficult. For example, such a material includes oxides and nitrides such as silicon oxide (SiO$_x$), silicon nitride (Si$_x$N$_y$), titanium oxide (TiO$_x$), and zirconium oxide (ZrO$_x$), and multilayer films containing these components. In addition, metals having melting points of 1,200° C. or more (e.g., W, Ir, and Pt) can be used. These selective growth mask materials stand growth temperatures of about 600° C. to 1,100° C. that are set to grow nitride semiconductor portions according to the present invention, and has the property of inhibiting the growth of any nitride semiconductor on its surface or making the grow of any nitride semiconductor difficult. For example, a vapor-phase film forming technique such as vapor deposition, sputtering, or CVD can be used to form a selective growth mask on the upper surface of the support member 10. In addition, the selective growth mask 13 having the windows 14 can be formed by using these materials as follows. A photomask having a predetermined shape is manufactured by photolithography. A film made of the above material is formed by a vapor-phase technique through this photomask, thereby forming the selective growth mask 13 having a predetermined shape. The shape of the selective growth mask 13 is not specifically limited. For example, this mask can be formed to have a dot pattern, a stripe pattern, or a lattice pattern. As will be described later, however, the selective growth mask is preferably formed as a plurality of individual or discrete stripes each oriented in a specific plane azimuth.

As described above, the selective growth mask 13 is preferably made up of a plurality of individual stripes 13a to 13e), as shown in FIG. 1A. In this case, the width (Ws) of each stripe mask is preferably 0.5 to 100 μm, more preferably 1 to 50 μm, still more preferably 5 to 20 μm, and especially preferably 5 to 15 μm. The ratio (Ws/Ww) of the width to the interval between the respective stripe masks (corresponding to the width of each window (Ww)) is preferably 1 to 20, and more preferably 1 to 10. It is especially preferable that the width of each stripe mask be larger than the width of each window. In this case, the ratio Ws/Ww more preferably falls within the range of more than 1 and up to 20, and more preferably more than 1 and up to 10. When the interval (Ww) between the stripe masks is set to 8 μm or less, preferably 5 μm or less, and more preferably 3 μm or less, a nitride semiconductor crystal having a much smaller number of crystal defects can be grown. The interval (Ww) between the stripe masks is preferably 0.1 μm or more. The respective stripe masks preferably have substantially the same width and thickness and are preferably formed at substantially the same intervals on the entire surface of the support member 10 to be parallel to each other.

The thickness of the selective growth mask 13 is preferably 0.01 to 5 μm, more preferably 0.1 to 3 μm, and especially preferably 0.1 to 2 μm.

The selective growth mask 13 inhibits any nitride semiconductor from growing from the portions covered with the mask and allows nitride semiconductor portions to selectively grow from the portions exposed through the windows. Owing to this function, this mask is referred to as a "selective growth" mask in the specification and the claims.

<Preferable Relationship Between Dissimilar Substrate and Selective Growth Mask>

Figure 3:
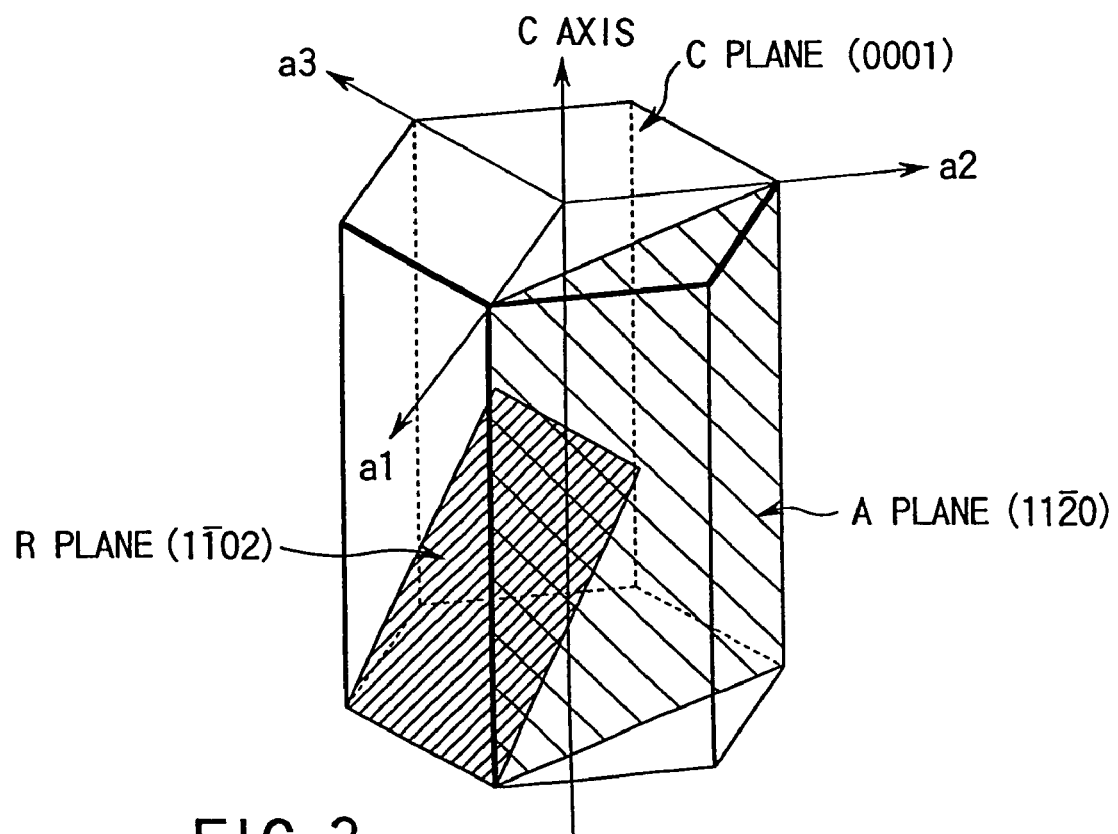
FIG. 3 is a view of a unit cell showing the crystal structure of a nitride semiconductor.
Figure 4:
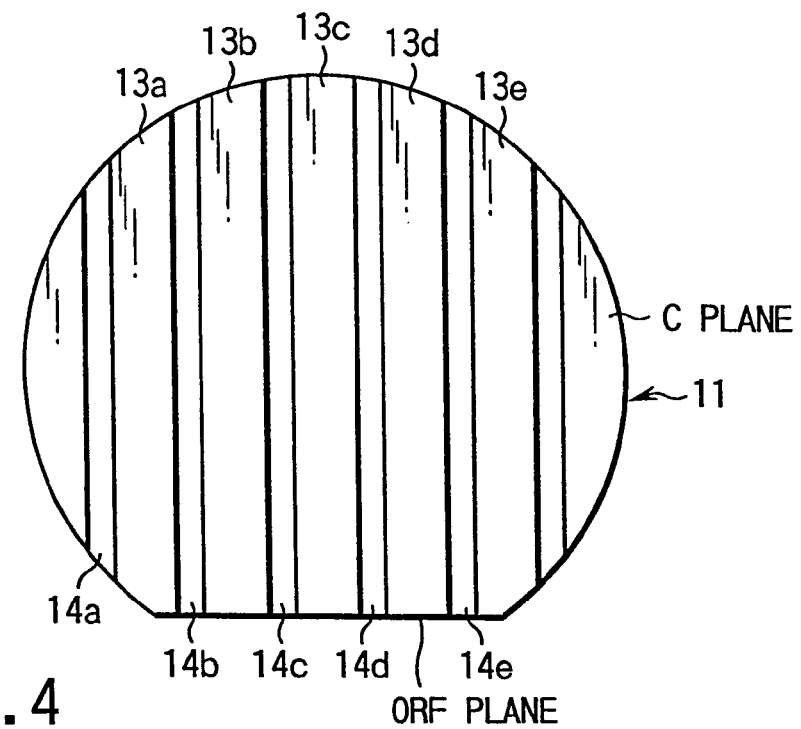
FIG. 4 is a plan view showing a support member on which a striped-shaped selective growth mask is formed.

FIG. 3 is a view of unit cell showing the crystal structure of a nitride semiconductor. Strictly speaking, the nitride semiconductor has a rhombic structure, but can be approximated to a hexagonal system in this manner. According to the method of the present invention, a sapphire substrate having the C plane as a major surface is preferably used as the dissimilar substrate 11, and the selective growth mask 13 is preferably made up of a plurality of individual stripes extending parallel in a direction perpendicular to the sapphire A plane (in other words, extending parallel in a direction (the <11$\bar{2}$0> direction of the nitride semiconductor) parallel to the M plane ((1$\bar{1}$00)) plane of the nitride semiconductor). That is, in FIG. 4, which is a plane view of the sapphire substrate on the major surface side, the sapphire substrate 11 has the sapphire C plane as the major surface and an orientation flat (ORF) surface as the A plane. As shown in FIG. 4, the selective growth mask 13 is preferably made up of a plurality of individual stripes extending parallel in a direction perpendicular to the sapphire A plane. It should be noted that although FIG. 4 shows only five individual stripes for the sake of easy understanding, more individual stripes are actually formed.

When a nitride semiconductor is to be selectively grown on the sapphire C plane, the nitride semiconductor tends to easily grow within the C plane in a direction parallel to the A plane, but does not easily grow in a direction perpendicular to the A plane. Therefore, the formation of stripe masks extending in a direction perpendicular to the A plane makes it easy to combine and grow the nitride semiconductor portions between the adjacent stripe masks on the respective stripe masks, thereby facilitating the growth of the nitride semiconductor crystal 16 shown in FIG. 1C. In this case, the leading surfaces, i.e., facets F (see FIG. 1B), of the nitride semiconductor crystals 15 grown laterally on the mask 13 become the A planes of the nitride semiconductor portions.

Similarly, in the case wherein a sapphire substrate having an A plane as a major surface is used as well, if, for example, the ORF surface forms the R plane, the formation of a plurality of individual strip masks extending parallel in a direction perpendicular to the R plane makes it easy to grow nitride semiconductor portions in the direction of width of the stripe masks. This makes it possible to grow a nitride semiconductor crystal having few crystal defects.

The growth of nitride semiconductor portions exhibit anisotropy also with respect to spinner ($MgAl_2O_4$). If the (111) plane is used as a growth surface (the major surface of the spinner) for a nitride semiconductor, and the ORF surface forms the (110) plane, the nitride semiconductor tends to easily grow in a direction parallel to the (110) plane. If, therefore, a plurality of parallel, discrete strip masks are formed to extend in a direction perpendicular to the (110) plane, the adjacent nitride semiconductor crystals combine with each other on the selective growth mask 13, thereby growing the nitride semiconductor crystal 16 having few crystal defects.

<Growth of Nitride Semiconductor Crystal>

The nitride semiconductor crystal to be grown according to the present invention can be grown by any of known methods suitable for the growth of a nitride semiconductor such as MOVPE, MBE, and HVPE, using a gaseous Group 3 element source and a gaseous nitrogen source. The nitride semiconductor crystal is preferably grown by MOVPE in the initial stage and grown by MOVPE or HVPE in the subsequent stage. As will be described in detail later, it is especially preferable that a nitride semiconductor crystal be grown by MOVPE in the initial stage and grown by HVPE in the subsequent stage.

When a nitride semiconductor is to be grown by MOVPE, the molar ratio of a nitrogen source gas to a Group 3 source gas (nitrogen source/Group 3 source molar ratio; to be sometimes referred to as a V/III ratio hereinafter) is preferably adjusted to 2,000 or less. The nitrogen source/Group 3 source molar ratio is preferably 1,800 or less, and more preferably 1,500 or less. The lower limit of the nitrogen source/Group 3 source molar ratio is not specifically limited as along as it is the stoichiometrical ratio or more. This lower limit molar ratio is preferably 10 or more, more preferably 30 or more, and most preferably 50 or more. If the molar ratio is higher than 2,000, triangular nitride semiconductor portions grow from the windows 14. With this growth, crystal defects extend and scarcely stop halfway. As a result, the number of crystal defects increases. If the nitrogen source/Group 3 source molar ratio is adjusted to 2,000 or less, the respective crystals 15 grow from the windows 14 first, and then grow laterally on the respective selective growth masks 13 while substantially maintaining their surfaces perpendicular to the upper surfaces of the selective growth masks. As a result, the similar perpendicular surfaces of the adjacent crystals that grow in the same manner come into contact and combine with each other on the selective growth mask 13. For this reason, the crystal defects tend to stop halfway on the upper surface of the selective growth mask. In addition, the crystal defects extending from the windows 14 tend to stop halfway. Therefore, a nitride semiconductor crystal having a much smaller number of crystal defects can be grown. It is especially preferable that MOVPE be performed under a reduced pressure of 50 to 400 Torr.

In MOVPE, as a nitrogen source gas, for example, a hydride gas, such ammonia or hydrazine is used; as a Group 3 source gas, an organogallium gas, such as TMG (trimethylgallium) or TEG (triethylgallium), an organoaluminum gas, such as TMA (trimethylaluminum), or an organoindium gas such as TMI (trimethylindium) can be used.

When a nitride semiconductor, e.g., a gallium nitride crystal, is to be grown by HVPE, HCl gas is fed onto a molten gallium metal, and ammonia gas is fed from another gas feed pipe to combine these gases on the support member 10 to cause the following reaction:

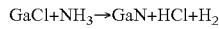

In HVPE, since the growth rate of a nitride semiconductor crystal is several times higher than in MOVPE, for example, a 300-μm thick nitride semiconductor can be grown within several hours.

In the present invention, a nitride semiconductor crystal is preferably grown to a thickness of 1 μm or more, more preferably 5 μm or more, and most preferably 10 μm or more, although it depends on the width of each selective growth mask. These values correspond to the range of the lower limits of the thickness of a nitride semiconductor crystal, which is to be set to cover the upper portion of each selective growth mask. If this thickness is less than 1 μm, a growing nitride semiconductor crystal tends to be difficult to grow laterally on each selective growth mask. This tends to relatively increase the number of crystal defects. It is difficult to decrease the number of crystal defects under the condition in which nitride semiconductor portions are difficult to grow laterally. Although the upper limit of the thickness of the nitride semiconductor to be grown is not specifically limited, the thickness is preferably set to 70 μm or less when crystal growth is to be performed by MOVPE. If a nitride semiconductor crystal is grown to a thickness exceeding 70 μm, the growth time is prolonged, and the surface of the nitride semiconductor crystal becomes coarse. In addition, the selective growth masks tend to decompose. For these reasons, the above thickness is not preferable.

In the present invention, it is especially preferable that the nitride semiconductor crystal (e.g., the crystal 16 or a crystal 17, 116, or 76 to be described below) grown to provide a substrate for supporting a nitride semiconductor device be made of undoped gallium nitride or n-type impurity-doped gallium nitride.

To grow a thicker nitride semiconductor crystal with few defects, the nitride semiconductor crystal is preferably grown by MOVPE first, and then MOVPE is switched to HVPE to grow further nitride semiconductor crystal on the MOVPE crystal.

Figure 5A:
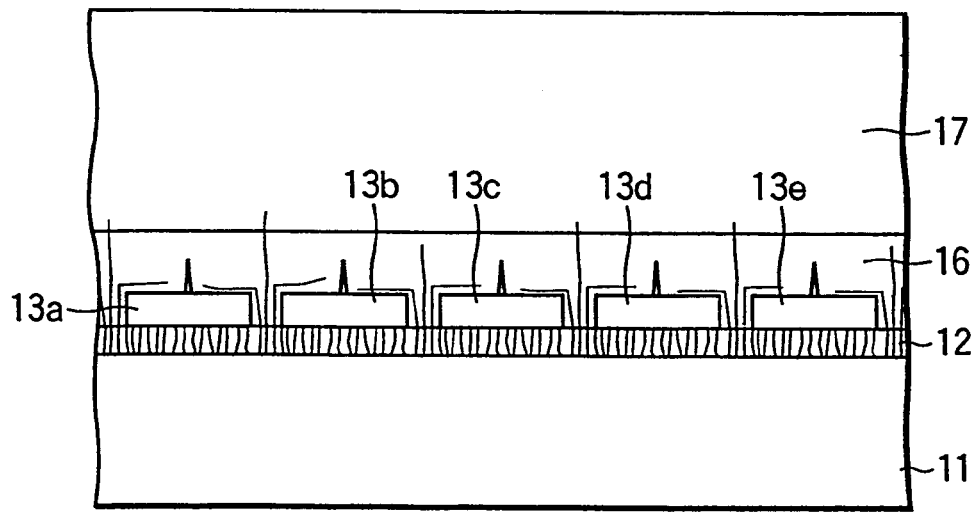
FIGS. 5A and 5B are schematic sectional views for explaining a nitride semiconductor growth method according to another embodiment of the present invention.
Figure 5B:

FIGS. 5A and 5B are sectional views for explaining a method of growing such a thicker nitride semiconductor crystal.

On the nitride semiconductor crystal 16, which is grown by MOVPE according to the first or second aspect described with reference to FIGS. 1A to 1C, a nitride semiconductor 17 of the same type is grown to a thickness larger than that of the nitride semiconductor crystal 16. When the nitride semiconductor 17 is grown on the MOVPE crystal 16 by HVPE, almost no crystal defects extend vertically. As a result, the crystal 17 having very few crystal defects can be grown as a whole. The crystal defects in the HVPE nitride semiconductor 17 are fewer than those in the MOVPE nitride semiconductor crystal 16 formed thereunder. Finally, for example, the nitride semiconductor crystal substrate 17 whose surface region has crystal defects of $1 \times 10^5/cm^2$ or less can be obtained. The crystal defects in the surface region are preferably $5 \times 10^4/cm^2$ or less, more preferably $1 \times 10^4/cm^2$ or less, and most preferably $1 \times 10^3/cm^2$ or less. Note that the "surface region" means a region having a depth of up to 5 μm from the upper surface (grown end face) of the nitride semiconductor crystal on the opposite side to the dissimilar substrate 11. The number of crystal defects within 5 μm can be measured with a TEM (Transmission Electron Microscope). In the present invention, the crystal defects in a grown nitride semiconductor crystal are visually checked with a TEM (i.e., visual check on a TEM photograph) by two-dimensional observation, and indicate an average defect density (the same applies to the following Examples).

The HVPE nitride semiconductor crystal 17 is thicker than the MOVPE nitride semiconductor crystal 16, and preferably has a thickness of 10 μm or more, more preferably 50 μm or more, and still more preferably 100 μm or more. If the thickness is less than 10 μm, the number of crystal defects tends to be difficult to decrease. Although the upper limit of thickness is not specified, the thickness is preferably 1 mm or less. If this crystal is grown to a thickness larger than 1 mm, the overall wafer warps due to the thermal expansion coefficient difference between the nitride semiconductor and the dissimilar substrate 11. This tends to make it difficult to grow an HVPE nitride semiconductor crystal with uniform thickness.

In the present invention, when the nitride semiconductor crystal 16 and/or 17 is to be grown, the nitride semiconductor is preferably doped with an n-type impurity. In addition, the crystal 16 or 17 is preferably doped with this n-type impurity such that the n-type impurity concentration has a gradient in each crystal. The concentration gradient may be continuous or stepwise. It is especially preferable to set the concentration gradient of the n-type impurity in each of the crystals 16 and 17 such that the n-type impurity concentration decreases with an increase in distance from the dissimilar substrate 11. In other words, the crystal 16 is preferably doped with the n-type impurity at higher concentrations with a decrease in distance from the dissimilar substrate 11. Similarly, the crystal 17 is preferably doped with the n-type impurity at higher concentrations with a decrease in distance from the dissimilar substrate 11. Assume that the n-type impurity concentration in each crystal decreases with a decrease in distance from the growth surface (major surface) in this manner. In this case, in forming an n-side electrode after a device structure is manufactured, when the nitride semiconductor substrate 16 is exposed by removing the dissimilar substrate 11, the underlayer 12, and the selective growth mask 13 or the nitride semiconductor substrate 17 is exposed by further removing the nitride semiconductor crystal substrate 16, the surface region, of the nitride semiconductor crystal 16 or 17, which is heavily doped with the n-type impurity can be exposed on the lower surface side. Therefore, by using this exposed surface as an n-side electrode formation surface, the output of the device can be increased by decreasing its Vf. In addition, even if etching is performed from the device structure side grown on the nitride semiconductor crystal substrate, and an electrode is formed on the etched surface, the nitride semiconductor crystal 16 or 17 heavily doped with the n-type impurity can be used as an n-electrode formation layer.

In the present invention, as the n-type impurity to be added to a nitride semiconductor crystal, a Group IV element, e.g., Si, Ge, Sn, or S, preferably Si and/or Sn, can be used. These n-type impurities can be added as hydrogenated substances or gaseous organic metallized substances during the growth of a nitride semiconductor. An n-type impurity is preferably added within the range of $5 \times 10^{16}/cm^3$ to $5 \times 10^{21}/cm^3$. If the impurity concentration is lower than $5 \times 10^{16}/cm^3$, since the carrier concentration of the nitride semiconductor crystal 16 or 17 becomes insufficient, the resistivity tends to increase. If the n-type impurity concentration is higher than $5 \times 10^{21}/cm^3$, the impurity concentration becomes excessively high. As a result, the crystallinity tends to deteriorate, and the number of crystal defects tends to increase. It is especially preferable to add an n-type impurity within the range of $1 \times 10^{17}/cm^3$ to $1 \times 10^{20}/cm^3$.

In the present invention, MOVPE can be switched to HVPE before the nitride semiconductor crystals 15 are combined into the integral crystal 16 by MOVPE (for example, in the state shown in FIG. 1B). More specifically, although the nitride semiconductor crystals 15 have been grown laterally on the mask 13 by MOVPE, growth of the HVPE nitride semiconductor crystal 17 can be started before the adjacent nitride semiconductor crystals 15 combine with each other.

As shown in FIG. 5A, after the nitride semiconductor crystals 16 and 17 are grown, the structure in FIG. 5A can be used as a device substrate, and a desired nitride semiconductor device structure can be formed on the substrate. Alternatively, a nitride semiconductor substrate having a two-layer structure made up of the nitride semiconductor crystals 16 and 17 can be obtained by polishing/removing at least the dissimilar substrate 11, the underlayer 12, and the selective growth masks 13a to 13e of the structure shown in FIG. 5A from the lower surface of the dissimilar substrate 11 in a direction perpendicular to the major surface of the dissimilar substrate 11. If the nitride semiconductor crystal 16 is further removed, a free nitride semiconductor substrate made of the HVPE nitride semiconductor crystal 17 can be obtained, as shown in FIG. 5B. As is also apparent from the above description, this HVPE nitride semiconductor substrate is characterized in that the crystal defects in the surface region are $1 \times 10^5/cm^2$ or less. This substrate can have at least one of the following characteristics: that the substrate is doped with an n-type impurity; that this n-type impurity has a concentration gradient in the nitride semiconductor substrate; and that the n-type impurity concentration decreases with a decrease in distance from the major surface (grown end face) of the substrate (i.e., with an increase in distance from the dissimilar substrate 11). From another viewpoint, the substrate obtained in this manner can be characterized in that it has first and second major surfaces, and is doped with an n-type impurity, and the n-type impurity has a concentration gradient in the substrate.

In the present invention, a buffer layer made of a nitride semiconductor can be grown first before the substantial portion of a nitride semiconductor crystal (e.g., a crystal to be grown laterally on each mask, such as the nitride semiconductor crystal 16) is grown. This buffer layer can be made of a nitride semiconductor such as AlN, GaN, AlGaN, or InGaN, and can be grown to a thickness of several ten angstroms to several hundred angstroms at a low temperature less than 900° C. The scope of the present invention incorporates the growth of this low-temperature buffer layer after the growth of the substantial portion of the nitride semiconductor crystal. This buffer layer is formed to ease the lattice mismatch between the dissimilar substrate and the nitride semiconductor grown afterward, but can be omitted depending on the nitride semiconductor growth method, the type of substrate, and the like.

Figure 6A:
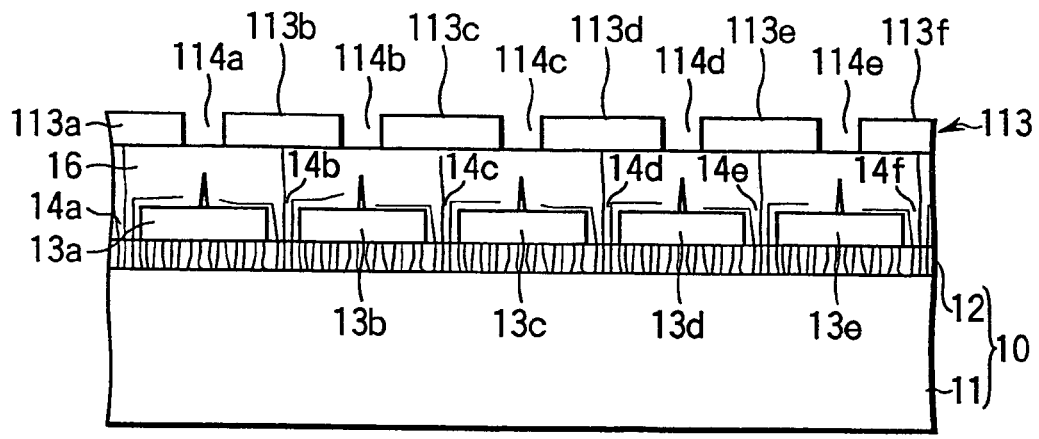
FIGS. 6A to 6C are schematic sectional views for explaining a nitride semiconductor growth method according to still another embodiment of the present invention in the order of the steps.
Figure 6B:
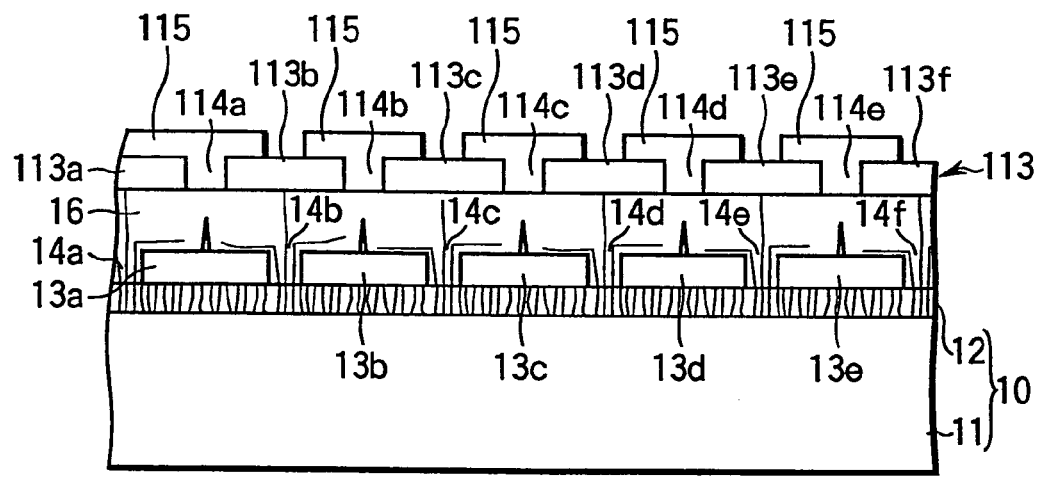
Figure 6C:
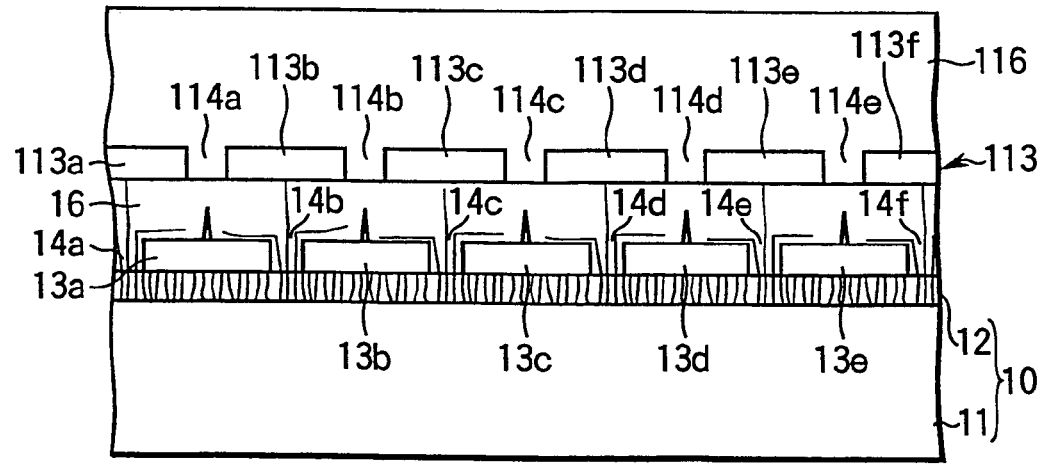

The second method of manufacturing a nitride semiconductor crystal having a smaller number of crystal defects will be described next with reference to FIGS. 6A to 6C. First of all, as shown in FIG. 6A, after the surface of the nitride semiconductor crystal 16 grown according to the first or second aspect of the present invention, which has been described in detail above, is polished to provide a flat surface, a selective growth mask 113 having a plurality of windows for partly exposing the surface of the nitride semiconductor crystal 16 is formed on the surface of the nitride semiconductor crystal 16. The description about the first selective growth mask 13 (the material, the shape, the width, the thickness, the shape of each window, the relationship with the dissimilar substrate, and the like) equally applies to the selective growth mask 113 unless otherwise specified.

The selective growth mask 113 is generally formed at a position shifted from the position where the first selective growth mask 13 is formed. That is, the selective growth mask 113 is formed to cover the surface of the portions, of the nitride semiconductor crystal 16, on which the crystal defects produced from the interface between the support member 10 and the nitride semiconductor crystal 16 and extending from the windows 14a to 14f of the first selective growth mask 13, thereby selectively exposing the surface of the nitride semiconductor crystal 16. More specifically, in FIG. 6A, similar to the first selective growth mask 13, the selective growth mask 113 is made up of individual stripes 113a to 113f, and the respective stripes are positioned to cover the surface regions, of the nitride semiconductor crystal 16, which correspond to the windows 14a to 14f of the selective growth mask 13. The windows 114a to 114e are positioned in the regions corresponding to the substantially middle portions of the first strip masks 13a to 13e. By forming the selective growth mask 113 at the position corresponding to each window 14 of the first selective growth mask 13 in this manner, the selective growth mask 113 can prevent the crystal defects in the crystal 16 from penetrating.

The total surface area of the selective growth mask 113 (the portions, of the nitride semiconductor crystal 16, which are covered with the mask) is preferably larger than the total surface area of the windows 14a to 14f of the selective growth mask 13 (the exposed portions, of the nitride semiconductor crystal 16, which are exposed through the windows). More specifically, if the selective growth mask 113 is formed to have a dot pattern, a stripe pattern, or the like, the area of the surface of a unit dot is set to be larger than that of a unit stripe window. With this setting, a nitride semiconductor having less crystal defects can be grown on the crystal 16.

When a nitride semiconductor crystal of the same type as that of the nitride semiconductor crystal 16 (preferably undoped or n-type impurity-doped GaN) is grown by the same method as that used to grow the nitride semiconductor crystal 16, nitride semiconductor crystals 115 grow in the same manner as that described about the crystal 15 with reference to FIG. 1B. Finally, the adjacent nitride semiconductor crystals 115 combine into the integral nitride semiconductor crystal 116. In this case, the second nitride semiconductor crystals 115 grown on the first nitride semiconductor crystal 16 are the same type of nitride semiconductor portions as that of the nitride semiconductor crystal 16. In addition, these crystals 115 are grown on the first nitride semiconductor crystal 16 having few crystal defects. For these reasons, crystal defects due to lattice mismatch do not easily occur, and fewer crystal defects are dislocated. Therefore, the second nitride semiconductor crystal 116 having excellent crystallinity can be obtained. By using this second nitride semiconductor crystal 116 as a growth substrate for a device structure, a nitride semiconductor device having excellent crystallinity can be realized. Obviously, the nitride semiconductor 116 can be doped with an n-type impurity as in the case of the nitride semiconductor 16 or 17 (see FIGS. 1C and 5A).

The growth of the second selective growth mask described with reference to FIGS. 6A to 6C and the subsequent growth of the nitride semiconductor crystal can be repeatedly performed. That is, if some portion of a nitride semiconductor crystal has lattice defects, a new mask can be formed on that portion, and a new nitride semiconductor can be grown on the mask.

The principle of a nitride semiconductor growth method according to the third aspect of the present invention will be described next. The third aspect of the present invention is associated with a nitride semiconductor growth method characterized in that after a nitride semiconductor is grown on a support member according to the present invention, a new nitride semiconductor is grown from this nitride semiconductor as a seed crystal in substantially only the lateral direction while the growth in the vertical direction is suppressed, and is grown in both the vertical and lateral directions afterward. In the present invention, to suppress the growth of the nitride semiconductor in the vertical direction is to prevent at least the nitride semiconductor from growing in the vertical direction. The nitride semiconductor can be grown in the lateral direction by exposing the surface of the initially grown nitride semiconductor in the vertical direction, and growing the above new nitride semiconductor from only the exposed surface. The nitride semiconductor whose growth direction is controlled in this manner starts to grow from the vertical direction to the lateral direction. As the growth continues, the nitride semiconductor starts to grow in the vertical direction again as well as in the lateral direction. In this manner, a nitride semiconductor crystal having a smaller number of crystal defects can be obtained.

The especially preferred embodiment of the nitride semiconductor growth method according to the third aspect of the present invention, in which the growth direction of a nitride semiconductor is controlled in this manner, will be described in detail below with reference to the FIGS. 7A to 7D.

Figure 7A:
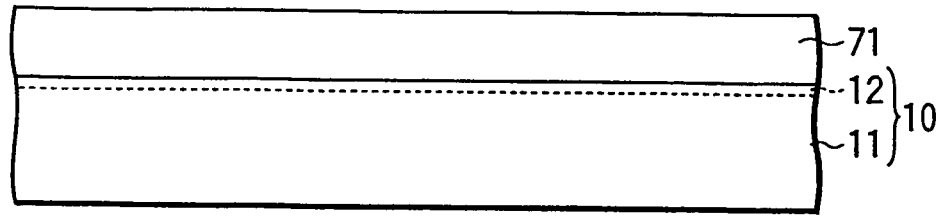
FIGS. 7A to 7D are schematic sectional views for explaining the principle of a nitride semiconductor growth method according to the third aspect of the present invention in the order of the steps.

As shown in FIG. 7A, a nitride semiconductor layer 71 is preferably formed on almost the entire surface of a support member 10 made of a dissimilar substrate 11 on which an underlayer 12 is formed or not formed. The support member 10, including the dissimilar substrate 11 and the underlayer 12, is identical to the one sufficiently described above.

The nitride semiconductor layer 71 is preferably made of gallium nitride (GaN) doped with no impurity (undoped) or GaN doped with an n-type impurity like the one described above. The nitride semiconductor layer 71 can be grown on the support member 10 at a high temperature, specifically 900° C. to 1,100° C., and more preferably 950° C. to 1,050° C. The thickness of each portion, of the nitride semiconductor layer 71, which is exposed from a side surface of a corresponding recess portion (to be described in detail later) after the formation of a growth control mask (to be described in detail later) is not specifically limited. However, the nitride semiconductor layer 71 is preferably formed such that each portion exposed from a side surface of a corresponding recess portion has a thickness of 100 angstroms or more, preferably about 1 to 10 µm, and more preferably about 1 to 5 µm.

Figure 7B:
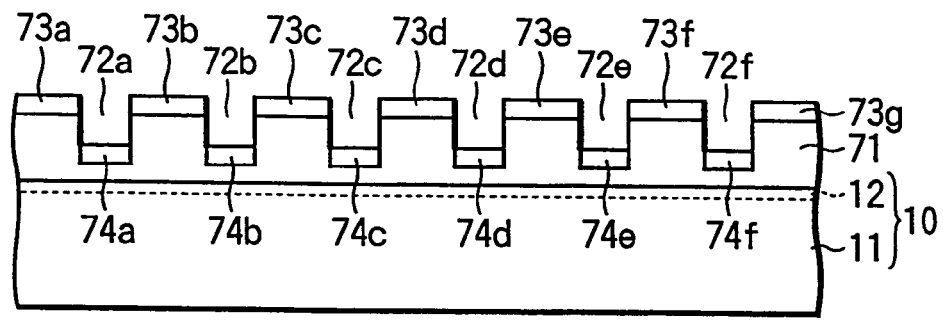

As shown in FIG. 7B, a plurality of recess portions (FIG. 7B shows six recess portions 72a to 72f; these recess portions will be sometimes generically referred to as recess portions 72 hereinafter) are formed in the nitride semiconductor layer 71 formed on the support member 10, and the first nitride semiconductor layer 71 is selectively exposed on the side surfaces of the respective recess portions 72. Thereafter, first growth control masks 73a to 73g and second masks 74a to 74f are formed on the upper surface portions of the nitride semiconductor layer 71 and the bottom surfaces of the recess portions 72a to 72f. The first growth control masks 73a to 73g will be sometimes generically referred to as first growth control masks or masks 73 hereinafter. The second growth control masks 74a to 74f will be sometimes generically referred to as second growth control masks or masks 74 hereinafter. The first and second growth control masks 73 and 74 can be formed by using the same material as that for the selective growth masks described above and the same method as used therefor.

The plurality of recess portions 72a to 72f may have any shapes as long as they allow the nitride semiconductor layer 71 to be selectively exposed on their side surfaces. For example, each recess portion can be formed into a cylindrical shape, a prismatic shape, or a groove-like shape. It is preferable that the bottom surface of each recess portion 72 be substantially parallel to the upper surface of the support member 10.

Each recess portion 72 formed in the nitride semiconductor layer 71 reaches some midpoint in the nitride semiconductor layer 71, the surface of the support member 10, or a portion in the support member 10. Although the depth of each recess portion 72 is influenced by the thickness of the nitride semiconductor layer 71, the thickness of each second growth control mask 74, and the like, it suffices to set the depth of each recess portion 72 such that the second growth control mask 74 formed on the bottom surface of the recess portion 72 prevents the dissimilar substrate 11 from being exposed, and the second growth control masks 74 is formed to have a sufficient thickness so as not to interfere with the growth of a new nitride semiconductor grown laterally from that surface, of the nitride semiconductor layer 71, which is exposed from a side surface of the recess portion 72. Each recess portion 72 is preferably formed at a depth that does not expose the substrate 11, and it is especially preferable that each recess portion 72 be formed at a depth corresponding to some midpoint in the direction of thickness of the nitride semiconductor layer 71. If the recess portion 72 is formed at a depth at which the dissimilar substrate 11 is exposed through the bottom surface of the recess portion 72, it is difficult to form the second growth control masks 74 near the corners of the bottom surface of the recess portion 72. If the second growth control masks 74 do not sufficiently cover the surface portions of the dissimilar substrate 11, new nitride semiconductor portions may grow from the dissimilar substrate 11, resulting in crystal defects. Although the depths of the recess portions 72 may differ from each other, the recess portions 72 are generally formed to have the same depth.

To form the recess portions 72, any method capable of partly removing the nitride semiconductor layer 71 can be used. Such a method includes etching, dicing, and the like. According to dicing, recess portions 72 made of parallel grooves each having a rectangular cross-section or recess portions 72 made of lattice grooves can be easily formed.

When the recess portions 72 are selectively formed in the nitride semiconductor layer 71 by etching, a striped photomask, a lattice photomask, and the like are manufactured by using mask patterns in various forms in photolithography, and a resist pattern is formed on the nitride semiconductor layer 71, thereby etching the nitride semiconductor layer 71. Methods of etching the nitride semiconductor layer 71 include wet etching, dry etching, and the like. To form smooth surfaces, dry etching is preferably used. Dry etching includes reactive ion etching (RIE), reactive ion beam etching (RIBE), electron cyclotron etching (ECR), ion beam etching (IBE), and the like. In any of these methods, the desired recess portions 72 can be formed by etching the nitride semiconductor by appropriately selecting an etching gas. For example, the etching means for a nitride semiconductor disclosed in Jpn. Pat. Appln. KOKAI Publication No. 8-17803 previously filed by the present applicant can be used.

When the recess portions 72 are to be formed by etching, each side surface of each recess portion 72 may be almost vertical to the dissimilar substrate 11 as shown in FIG. 7B, or may have a mesa shape or inverted mesa shape.

The first and second masks 73 and 74 can be formed in slightly different manners depending on whether the recess portions 72 are formed by etching or dicing.

When the recess portions 72 are to be formed by etching, a layer made of a mask material is formed first on the first nitride semiconductor layer 71, and then a resist film is formed on the layer. After a predetermined pattern is transferred, exposed, and developed to form the first mask 73, the nitride semiconductor layer 71 is etched to form the recess portions 72. Subsequently, a growth control mask material layer is formed on the nitride semiconductor layer 71 in which the recess portions 72 are formed, i.e., the masks 73, the bottom and side surfaces of the recess portions 72, and the like, and the mask material layer on the side surfaces of the recess portions 72 is selectively etched to form the second masks 74 by dry etching using, for example, $CF_4$ gas and $O_2$ gas. With this formation, although FIG. 7B shows the first mask 73 as a single layer, the first mask 73 has two-layer structure in which the mask material layer is further formed on the first mask 73. Obviously, the first and second masks 73 and 74 may be formed on the portions where the first masks 73 are formed and the bottom surfaces of the recess portions 72 by the same method as described above after the first masks 73 are removed before the second masks 74 are formed.

When the recess portions 72 are to be formed by dicing, the recess portions 72 are formed by removing the nitride semiconductor layer 71 from the upper surface with a dicing saw, and a growth control mask material layer is formed on the entire surface of the nitride semiconductor layer 71, including the recess portions 72, as described above. Thereafter, only the growth control mask material layer on the side surface portions of the recess portions 72 is etched by dry etching using $CF_4$ gas and $O_2$ gas, thereby simultaneously forming the first and second growth control masks 73 and 74.

The first and second growth control masks 73 and 74 may be formed to have the same thickness as long as they have thicknesses that do not interfere with the growth of a nitride semiconductor crystal to be described in detail later. For example, when the underlayer 12 is not formed on the dissimilar substrate 11, the second growth control masks 74 are preferably formed to have a sufficient thickness so as not to expose the dissimilar substrate 11 to the bottom surfaces of the recess portions 72, and preferably a sufficient thickness that inhibits formation of pinholes in the dissimilar substrate 11 due to the influence of heat. Obviously, however, the masks 74 must not be thickened to such an extent as to interfere with the growth of nitride semiconductor crystals from the portions, of the nitride semiconductor layer 71, which are exposed to the side surfaces of the recess portions. If pinholes are formed in the second masks 74, nitride semiconductor portions may grow through the pinholes. This is considered as a cause for crystal defects. If, for example, the first growth control mask 73 is formed to be relatively thin, the barrier height that a nitride semiconductor crosses (the thickness of the first growth control mask 73) decreases. Therefore, a nitride semiconductor easily grows laterally on the masks 73. The formation of such growth control masks is obvious to a person skilled in the art. For example, these growth control masks can be formed in two separate processes.

The relationship between the first growth control mask 73 and the dissimilar substrate 11 is preferably equivalent to the previously described relationship between the selective growth mask and the dissimilar substrate 11. Therefore, the items described under the tile <Preferable Relationship between Dissimilar Substrate and Selective Growth Mask> equally apply to the first growth control mask 73. More specifically, the first growth control mask 73 is preferably made up of a plurality of individual stripes each having a substantially rectangular cross-section. In this case, the respective stripes are preferably formed on the sapphire C plane to extend parallel in a direction perpendicular to the sapphire A plane., or on the sapphire A plane to extend parallel in a direction perpendicular to the sapphire R plane. Alternatively, the respective individual stripes are preferably formed on the spinnel (111) plane to extend parallel in a direction perpendicular to the spinnel (110) plane. Therefore, the respective recess portions 72 are preferably formed by a plurality of individual grooves extending in the same direction as that of the striped growth control mask 73. The top surface of each wall defined between adjacent grooves preferably has the same plane shape as that of each striped growth control mask 73.

Each of the plurality of striped growth control masks 73 preferably has a width (corresponding to the width Ws of the first selective growth mask) of 1 to 20 μm, and more preferably 10 to 20 μm. The interval between the masks 73 is preferably 1 to 20 μm, and more preferably 2 to 5 μm.

Figure 7C:
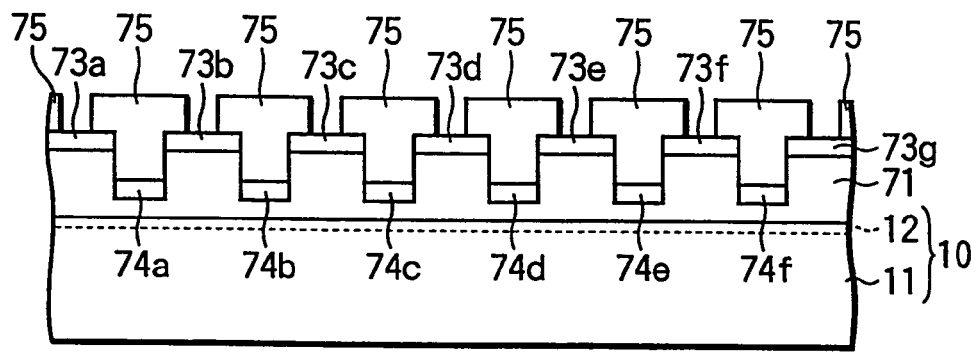

After the recess portions 72 and the first and second growth control masks 73 and 74 are formed in this manner, nitride semiconductor portions 75 are grown from the exposed side surfaces of the nitride semiconductor layer 71 by the vapor-phase growth method described in association with the first and second aspects, as shown in FIG. 7C.

Figure 7D:
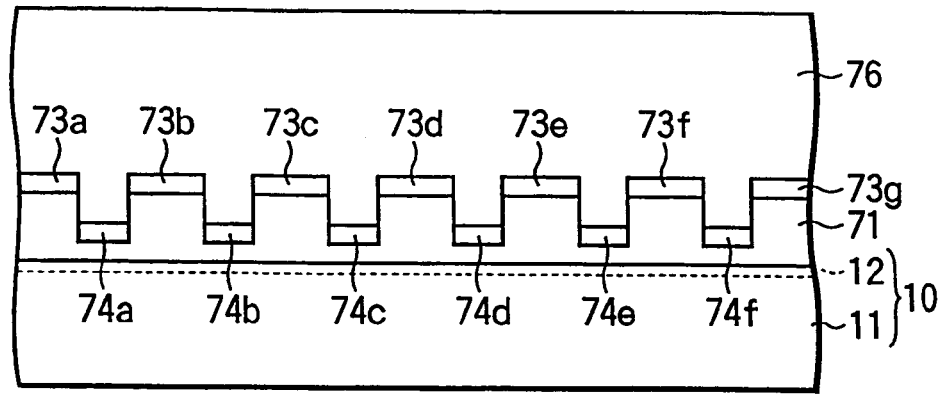

As described with reference to FIG. 7B, the upper surface portions (i.e., the top surfaces of the walls between the recess portions) of the nitride semiconductor layer 71, except for the side surfaces of the recess portions 72 formed therein, and the bottom surfaces of the recess portions 72 are covered with the growth control masks 73 and 74, and the nitride semiconductor layer 71 is exposed on only the side surfaces of the recess portions 72. For this reason, nitride semiconductor portions are grown from only these selective exposed surfaces of the nitride semiconductor layer 71 by the vapor-phase growth method. That is, the nitride semiconductor portions 75 start to grow laterally from the exposed side surfaces of the nitride semiconductor layer 71. As the nitride semiconductor portions 75 keep growing, they start to grow vertically as well as laterally. When the nitride semiconductor portions 75 reach the upper surfaces of the recess portions 72, each nitride semiconductor portion grows laterally from the two sides of each recess portion on the first growth control mask 73. As described in association with the first and second aspects, the adjacent nitride semiconductor portions 75 combine into an integral nitride semiconductor crystal 76, as shown in FIG. 7D. The nitride semiconductor crystal 73 whose growth direct on is controlled in the initial growth period has good crystallinity with very few crystal defects even if the crystal is grown thick.

The nitride semiconductor crystal 75 to be grown is preferably a nitride semiconductor of the same type as that of the nitride semiconductor layer 71, and especially preferably undoped or n-type impurity-doped GaN. When the nitride semiconductor crystal 76 is to be doped with an n-type impurity during growth, the impurity can have a concentration gradient, as described previously.

In the third aspect, the second growth control mask 74 is preferably formed. Even if this mask is not formed, a nitride semiconductor crystal having excellent crystallinity can be grown. In this case, the description about the first selective growth masks 13 and the first windows 14 in association with the first and second aspects can be equally applied to the first growth control masks 73 and the recess portions 72 by regarding the first selective growth masks 13 and the first windows 14 described in association with the first and second aspects as the first growth control masks 73 and the recess portions 72. In this case, each recess portion 72 should have a depth that does not expose the surface of the support member 10. In this case, it is especially preferable that each recess portion have a depth of 500 angstroms to 5 µm.

As is obvious from the above description, each of the nitride semiconductor crystals 16, 17, 116, and 76 (to be sometimes generically referred to as a substrate 1000 hereinafter) grown by the method of the present invention has very few defects, and can be effectively used as a substrates for supporting a predetermined nitride semiconductor device thereon.

It can be described that a nitride semiconductor substrate of the present invention, especially the nitride semiconductor substrate grown by the method according to the first to third aspects, has first and second major surfaces, the crystal defects in a region near the first major surface (i.e., the surface on which a device structure is supported or the grown end face) are relatively few, and the crystal defects in a region near the second major surface are relatively many. The second major surface is a major surface closer to the dissimilar substrate 11 than the first major surface. If this nitride semiconductor substrate is doped with an n-type impurity, since the n-type impurity tends to concentrate in a region having many crystal defects, a surface region near the second major surface can form an $n^+$-type region. If, therefore, an n-side electrode of a nitride semiconductor device is formed in this region, the threshold or forward voltage of the device can be decreased.

It can also be described that regions (first regions) each having a relatively small number of crystal defects and regions (second regions) each having a relatively large number of crystal defects are unevenly distributed when viewed from the first major surface of the nitride semiconductor substrate of the present invention. The first regions correspond to the masks 13 and 73. The second regions correspond to the windows 14 and the recess portions 72.

The device structure of the nitride semiconductor device of the present invention is supported on the nitride semiconductor substrate of the present invention. In this case, the nitride semiconductor substrate of the present invention may support the device structure in a free state wherein the support member 10 and the masks (13, 113, 73, 74, or the like) are removed, or may support the device structure in a state wherein the support member 10 and the masks are formed. In addition, the device structure can be formed on the nitride semiconductor of the present invention in the free state set in advance, or the nitride semiconductor can be set in the free state by removing the support member 10 and the masks after the device structure is formed on the nitride semiconductor with the support member 10 and the masks being formed.

The nitride semiconductor substrate in the free state according to the present invention preferably has a thickness of 70 µm or more, more preferably 100 µm or more, and still more preferably 300 µm or more. With a thickness of 70 µm or more, the nitride semiconductor substrate becomes resistant to cracking and allows easy handling. Although the upper limit of the thickness is not specified, the substrate preferably has a thickness of 1 mm or less.

The nitride semiconductor substrate having the dissimilar substrate according to the present invention preferably has a thickness of 1 to 50 µm. If the thickness falls within this range, the frequency of warpage of the overall wafer due to the thermal coefficient difference between the nitride semiconductor substrate and the dissimilar substrate 11 decreases.

The device structure to be supported on the nitride semiconductor substrate of the present invention is not specifically limited as long as it has a predetermined device function, and includes an LED device structure, an LD device structure, and the like. However, the device structure is not limited to these. The device structure of the present invention can include at least an n- or p-type nitride semiconductor. For example, a device structure can be presented, which has an n-type nitride semiconductor layer having a superlattice structure as an n-type nitride semiconductor layer, and in which an n-type nitride semiconductor that allows an n-side electrode to be formed on the n-type layer of this superlattice structure is formed. For example, each of the LED device and LD device of the present invention basically has an active layer and two cladding layers formed on the two sides of the active layer.

In addition, as other arrangements of the nitride semiconductor device, e.g., electrode and device shapes, any suitable electrode and shape can be used.

In the present invention, the p and n sides mean opposite sides with respect to, for example, an active layer; the p side is a side including a nitride semiconductor layer that can be doped with a p-type impurity, and the n side is a side including a nitride semiconductor layer that can be doped with an n-type impurity.

Figure 8A:
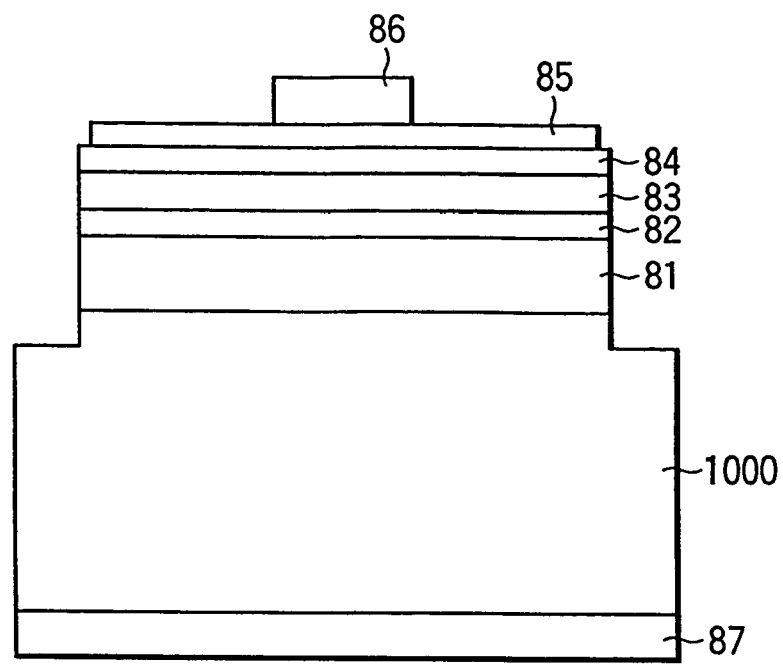
FIG. 8A is a sectional view schematically showing a nitride semiconductor light-emitting diode device supported on a nitride semiconductor substrate of the present invention.
Figure 8B:
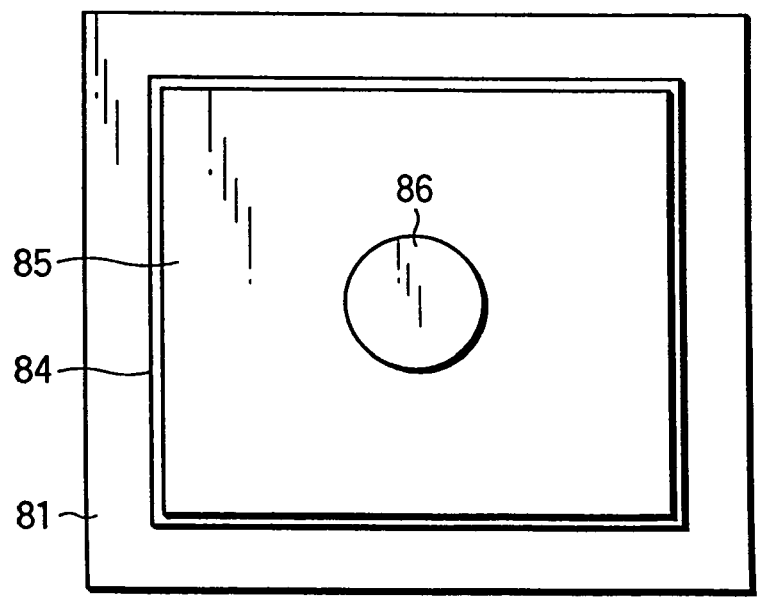
FIG. 8B is a plane view of the light-emitting diode device in FIG. 8A.

FIG. 8A is a schematic sectional view showing the LED device structure formed on the nitride semiconductor substrate 1000. FIG. 8B is a plan view of the structure. As is apparent from FIG. 8B, this LED device has an almost rectangular parallelepiped shape as a whole.

As shown in FIG. 8A, an n-side buffer layer 81 made of a nitride semiconductor doped with an n-type impurity such as Si, e.g., n-type GaN, is formed on the nitride semiconductor substrate 1000. In general, this buffer layer 81 is a nitride semiconductor crystal grown at a high temperature of 900° C. or more. This high-temperature buffer layer 81 is discriminated from a low-temperature buffer layer (e.g., the buffer layer 12 in FIGS. 1A to 1C) to be grown at a low temperature to ease the lattice mismatch between the substrate and the nitride semiconductor grown thereon, and serves as an n-type cladding layer. In manufacturing an LED device, the buffer layer 81 is preferably formed to have a thickness of 20 angstroms or more. The buffer layer 81 preferably has a distorted superlattice structure formed by alternately stacking first and second nitride semiconductor layers having different compositions. The buffer layer having the superlattice structure can provide an n-side cladding layer having excellent crystallinity as a carrier confining layer. For example, a buffer layer having such a superlattice structure can be formed by alternately stacking an aluminum-containing nitride semiconductor doped with an n-type impurity, especially thin AlGaN layers, and undoped GaN layers. Note that the buffer layer having the superlattice structure preferably has a thickness of 50 angstroms or more.

An active layer 82 is formed on the buffer layer 81. It is especially preferable that the active layer 82 have a quantum well structure including a well layer made of InGaN. The quantum well structure includes both a single quantum well (SQW) structure and a multi quantum well (MQW) structure. The multi quantum well structure is preferable. An active layer having a multi quantum well structure can be formed by, for example, alternately stacking first and second thin InGaN layers having different compositions or alternately stacking thin InGaN layers and GaN layers. When the active layer 82 has a quantum well structure, one or both of the well layer and the barrier layer can be doped with an n- or p-type impurity or no impurity. If the active layer 82 has not a quantum well structure, the active layer is doped with an n-type impurity and/or a p-type impurity.

A p-side cladding layer 83 made of a p-type nitride semiconductor doped with a p-type impurity, e.g., Mg, is formed on the active layer 82. The p-side cladding layer 83 is preferably made of an aluminum-containing nitride semiconductor, especially AlGaN.

A p-side contact layer 84 made of a p-type nitride semiconductor doped with a p-type impurity, e.g., Mg, is formed on the p-side cladding layer 83. It is especially preferable that this p-side contact layer 84 be made of p-type GaN.

A light-transmitting p-electrode 85 is formed on almost the entire surface of the p-side contact layer, and a disk-like bonding pad 86 is formed on substantially the central portion of the p-electrode 85.

As shown in FIG. 8A, the p-side contact layer 84, the p-side cladding layer 83, the active layer 82, and the buffer layer 81 are etched to expose their side surfaces. This etching proceeds until it reaches a portion in the surface of the substrate 1000 to form a "cutting margin". The formation of the cutting margin upon etching in this manner reduces the impact applied to the p-n junction when each chip is cut later. As a result, LED devices each having higher reliability can be obtained, and the yield improves. In addition, this "cutting margin" is preferably formed on a portion corresponding to each window portion 14 of the first selective growth mask 13. Furthermore, with the formation of the "cutting margin", when the sapphire substrate, the first selective mask, and the like are removed, a chip cutting position that indicates a region having many crystal defects and a region having few crystal defects can be accurately discriminated.

As described above, by doping the nitride semiconductor substrate 1000 with an n-type impurity, an n-side electrode 87 can be formed on the entire lower surface of the substrate 1000.

Figure 9:
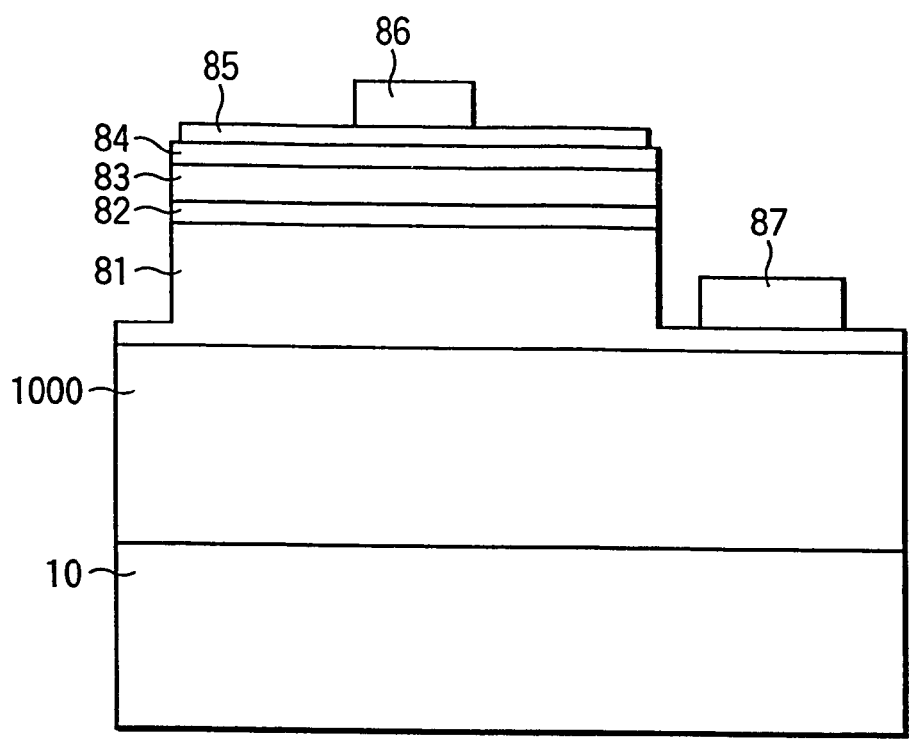
FIG. 9 is a sectional view schematically showing another nitride semiconductor light-emitting diode device supported on a nitride semiconductor substrate of the present invention.

FIG. 9 schematically shows a cross-section of an LED device having a structure similar to that of the LED device in FIGS. 8A and 8B except that the nitride semiconductor substrate of the present invention is kept supported on the support member 10. In the LED device shown in FIG. 9, a p-side contact layer 84, a p-side cladding layer 83, and an active layer 85 are etched to expose their side surfaces. This etching reaches the n-side buffer layer 81 as well to partly leave the n-side buffer layer 81. An n-side electrode 87 is formed on the surface of the left n-side buffer layer 81.

Figure 10:
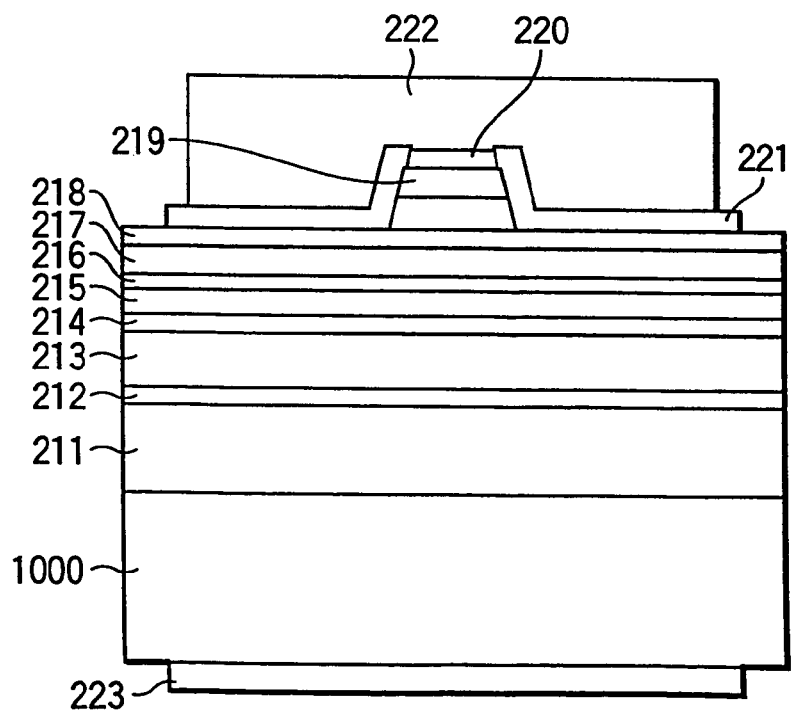
FIG. 10 is a sectional view schematically showing a nitride semiconductor laser diode device supported on a nitride semiconductor substrate of the present invention.

FIG. 10 is a schematic sectional view showing the laser diode (LD) structure formed on the substrate 1000 of the present invention.

A buffer layer 111 made of a nitride semiconductor is formed on the nitride semiconductor substrate 1000. This buffer layer 211 is a nitride semiconductor single-crystal layer grown at a high temperature of 900° C. or more. This layer is discriminated from a low-temperature buffer layer (e.g., the buffer layer 12 in FIGS. 1A to 1C) to be grown at a low temperature to ease the lattice mismatch between the substrate and the nitride semiconductor grown thereon. When an LD device is to be manufactured, this buffer layer 211 preferably has a thickness of 100 angstroms or less, more preferably 70 angstroms or less, and most preferably 50 angstroms or less, and is preferably formed into a distorted superlattice structure obtained by alternately stacking first and second thin nitride semiconductor layers having different compositions. With the distorted superlattice structure, the crystallinity improves, and hence a high-output LD device can be realized. Note that this buffer layer 211 can be omitted.

A crack prevention layer 212 made of a nitride semiconductor is formed on the buffer layer 211. If this crack prevention layer 212 is made of an indium-containing n-type nitride semiconductor, preferably InGaN, the occurrence of cracks in the aluminum-containing nitride semiconductor layer that can be formed layer can be effectively prevented. The crack prevention layer 212 is most preferably made of $In_xGa_{1-x}N$ (0<x<0.5). The crack prevention layer 212 is preferably formed to have a thickness from 100 angstroms to 0.5 µm. If this layer is thinner than 100 angstroms, the layer is difficult to serve as a crack prevention layer. If the layer is thicker than 0.5 µm, the crystal itself tends to become black. Note that the crack prevention layer 212 can be omitted.

An n-side cladding layer 213 made of an n-type nitride semiconductor is formed on the crack prevention layer 212. This n-side cladding layer 213 serves as both a carrier confining layer and a light confining layer. The n-side cladding layer 213 preferably has a superlattice structure obtained by alternately stacking first and second nitride semiconductor portions having different band gap energies. Such a superlattice structure preferably includes an aluminum-containing nitride semiconductor, and more preferably AlGaN. In this case, the threshold of the LD device can be decreased by performing so-called modulated doping, i.e., doping either the first layer or the second layer with an impurity at a higher concentration. For example, the n-side cladding layer 213 having such a superlattice structure can be formed by alternately stacking thin AlGaN layers doped with an n-type impurity, e.g., Si, and undoped thin GaN layers. The superlattice structure can provide a carrier confining layer having good crystallinity without any crack. The n-side cladding layer 213 preferably has a thickness from 100 angstroms to 2 µm, and more preferably from 500 angstroms to 1 µm.

An n-side light guide layer 214 made of a nitride semiconductor is formed on the n-side cladding layer 213. This n-side light guide layer 214 serves as a guide layer for light from an active layer 215 (to be described later), and is preferably made of GaN or InGaN. The n-side light guide layer 214 is preferably formed to have a thickness of 100 angstroms to 5 µm, and more preferably 200 angstroms to 1 µm. In general, the n-side light guide layer 214 is doped with an n-type impurity, e.g., Si or Ge, to have an n-type conductivity, but not be doped with such an impurity. The n-side light guide layer 214 can be a layer having a superlattice structure. The n-side light guide layer 214 having such a superlattice structure can be formed by alternately stacking, for example, first layers made of a first nitride semiconductor, e.g., GaN, and second layers made of a second nitride semiconductor different from the first nitride semiconductor, e.g., InGaN. In this case, at least one of the first and second layers may be doped with an n-type impurity or may not be doped.

In the present invention, the magnitude of band gap energy is determined with reference to the band gap energy of a layer having a higher band gap energy in a superlattice structure, whereas the magnitude of band gap energy of an active layer having a quantum well structure is determined with reference to the band gap energy of a well layer.

The active layer 215 made of a nitride semiconductor is formed on the n-side light guide layer 214. It is especially preferable that this active layer 215 have a quantum well structure having a well layer made of an indium-containing nitride semiconductor (preferably InGaN or InAlN). Such a quantum well structure may be a single quantum well (SQW) structure or a multi quantum well (MQW) structure including a well layer and a barrier layer. The multi quantum well structure is preferable. For example, a multi quantum well structure can be formed by alternately stacking InGaN nitride semiconductors having different compositions, or may be formed by alternately stacking GaN and InGaN layers. An active layer having a quantum well structure allows a well layer and/or a barrier layer to be doped with an impurity or no impurity. An active layer having an undoped quantum well structure is preferable. In this case, as a well layer, an InAlN layer can be used in place of an InGaN layer.

A p-side cap layer 216 having a band gap energy higher than that of a p-side light guide layer 217 (to be described later) and that of an active layer 215 (a well layer in a quantum well structure) is formed on the active layer 215. The p-side cap layer 216 is preferably formed to have a thickness of 0.1 µm or less, more preferably 500 angstroms or less, and most preferably 300 angstroms or less. If the thickness of the p-side cap layer 216 is larger than 0.1 µm, the p-side cap layer 216 tends to crack. The p-side cap layer 216 therefore tends to be difficult to grow as a nitride semiconductor with good crystallinity. The p-side cap layer 216 is made of an aluminum-containing nitride semiconductor, especially preferably AlGaN. In this case, as the composition ratio of Al of AlGaN increases, the laser oscillation of the LD device is facilitated with a decrease in the thickness of the p-side cap layer 216. If, for example, the p-side cap layer 216 is to be made of $Al_yGa_{1-y}N$ wherein the y value is 0.2 or more, it is especially preferable to adjust the thickness of the p-side cap layer 216 to 500 angstroms or less. Although the lower limit of the thickness of the p-side cap layer 216 is not specified, the p-side cap layer 216 is preferably formed to have a thickness of 10 angstroms or more. The p-side cap layer 216 may be doped with a p-type impurity to become a p-type layer. However, this layer may be doped with an n-type impurity to become a carrier-compensated i-type layer or may be undoped because it is thin. Most preferably, the p-side cap layer 216 is doped with a p-type impurity.

The p-side light guide layer 217 made of a nitride semiconductor having a band gap energy lower than that of the p-side cap layer 216 is formed on the p-side cap layer 216. This p-side light guide layer 217 serves as a guide layer for light from the active layer 215, and is preferably made of GaN or InGaN, similar to the n-side light guide layer 214. In addition, the p-side light guide layer 217 can serve as a barrier layer during the growth of a p-side cladding layer 218 (to be described later). The p-side light guide layer 217 is preferably formed to have a thickness of 100 angstroms to 5 µm, and more preferably 200 angstroms to 1 µm so as to serve as a desirable light guide layer. In general, the p-side light guide layer 217 is doped with a p-type impurity, e.g., Mg, to have a p-type conductivity, but may not be doped. Note that the p-side light guide layer 217 may have a superlattice structure. Such a superlattice structure can be formed by sequentially stacking first and second nitride semiconductor layers having different band gap energies. The p-side light guide layer 217 having this superlattice structure can be formed by alternately stacking, for example, first layers made of GaN and second layers made of InGaN. In this case, at least one of the first and second layers may be doped with a p-type impurity or may not be doped.

The p-side cladding layer 218 made of a nitride semiconductor is formed on the p-side light guide layer 217. Similar to the n-side cladding layer 213, this layer 218 serves as a carrier confining layer and a light confining layer. The p-side cladding layer 218 preferably contains an aluminum-containing nitride semiconductor, and more preferably AlGaN. When this layer is formed as a superlattice structure, it serves to decrease the resistivity of the p-side layer. Such a superlattice structure can be formed by sequentially stacking first and second nitride semiconductor layers having different band gap energies. In this case, the threshold of the LD device can be decreased by performing so-called modulated doping, i.e., doping either the first layer or the second layer with an impurity at a higher concentration. For example, this p-side cladding layer 218 can be formed by alternately stacking first thin layers made of AlGaN doped with a p-type impurity, e.g., Mg, and second thin layers made of undoped GaN. The p-side cladding layer 218 is preferably formed to have a thickness from 100 angstroms to 2 µm, and more preferably from 500 angstroms to 1 µm.

To decrease the forward voltage Vf of the LD device, making the p-side cladding layer 218 have a superlattice structure is preferable to make the n-side cladding layer 213 have a superlattice structure because the resistance of each p-side layer tends to decrease.

In a nitride semiconductor device having a double-hetero structure including the active layer 215 having a quantum structure, especially an LD device, it is very preferable that the cap layer 216 having a band gap energy higher than that of the active layer 215 and a thickness of 0.1 µm or less and containing an aluminum-containing nitride semiconductor be formed in contact with the active layer 215, the p-side light guide layer 217 having a band gap energy lower than that of the cap layer 216 and containing a nitride semiconductor be formed at a greater distance from the active layer 85 than the cap layer 86, and the p-side cladding layer 218 having a band gap energy higher than that of the p-side light guide layer 217, containing an aluminum-containing nitride semiconductor, and having a superlattice structure be formed at a greater distance from the active layer 215 than the p-side light guide layer 217. In this case, since the p-side cap layer 216 has a larger band gap energy, the electrons injected from the n-side layer are blocked by the cap layer 216. As a result, the electrons do not overflow the active layer 215, and hence the leakage current of the LD device is reduced.

The LD device structure is basically made up of the n-side cladding layer 213, the n-side light guide layer 214, the active layer 215, the p-side light guide layer 217, and the p-side cladding layer 218.

In addition, a p-side contact layer 219 made of a p-type nitride semiconductor is formed on the p-side cladding layer 218 to mount a p-electrode. This p-side contact layer 219 is preferably made of $In_aAl_bGa_{1-a-b}N$ (0≦x, 0≦y, x+y≦1) doped with a p-type impurity, especially GaN doped with a p-type impurity, especially Mg. The p-side contact layer 219 is preferably formed to have a thickness of 500 angstroms or less, more preferably from 20 angstroms and 400 angstroms.

As shown in FIG. 10, the p-side contact layer 219 as the uppermost layer and part of the p-side cladding layer 218 are etched in the form of stripes to form a ridge. A p-side electrode 220 is formed on the entire surface of the top surface of this ridge. The p-side electrode 220 is preferably made of Ni, Pt, Pd, Co, Ni/Au (multilayer or alloy), Pt/Au (multilayer or alloy), or Pd/Au (multilayer or alloy) to achieve more desirable ohmic contact with the p-side contact layer 219.

An insulating film 221 preferably made of $SiO_2$ or $ZrO_2$ is formed on the exposed surfaces of the p-side cladding layer 218 and the p-side contact layer 219 except for the top surface of the p-side electrode 220. A p-side pad 222 electrically connected to the p-side electrode 220 through this insulating film 221 is formed.

Furthermore, as described above, the nitride semiconductor substrate 1000 has been doped with an n-type impurity to form an n-side electrode 223 on almost the entire lower surface of the substrate. If the n-side electrode 223 is made of a metal such as Al, Ti, W, Cu, Zn, Sn, or In, a multilayer made of these metals, or an alloy of the metals, more desirable ohmic contact with an n-type layer (the lower surface of the substrate 1000 in this case) can be achieved. As a metallization for mounting a heat sink (not shown) on the n-side electrode 223, a thin metal film (not shown) having a two-layer structure preferably made of Au/Sn is formed.

Figure 11:
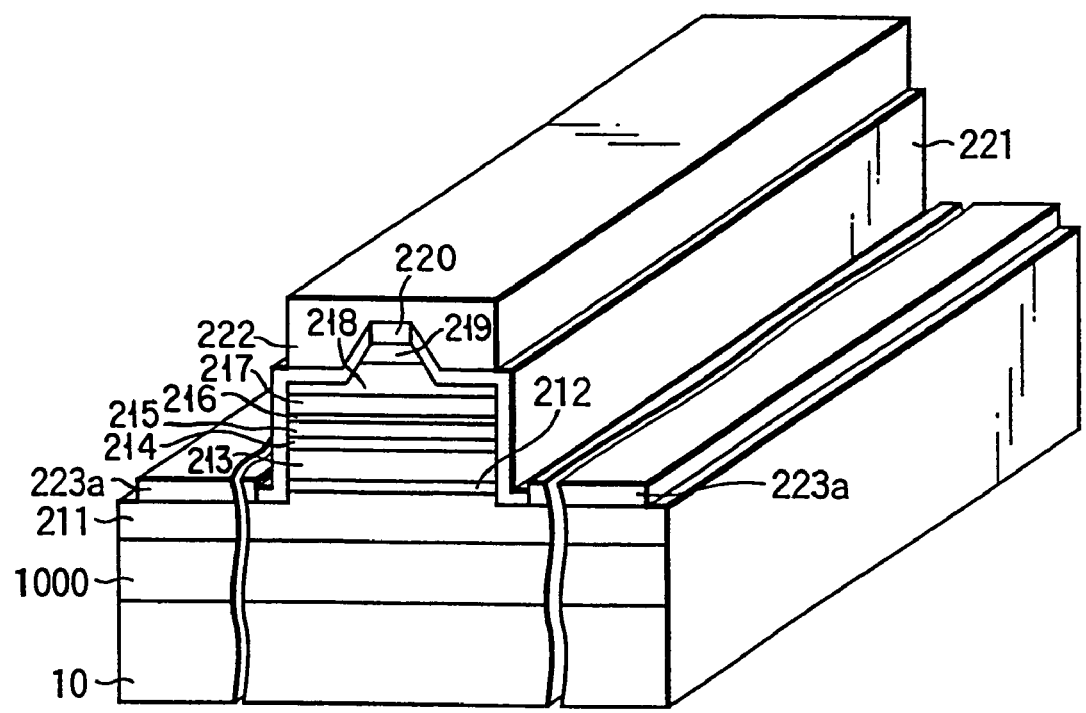
FIG. 11 is a partially sectional perspective view schematically showing another nitride semiconductor laser diode device supported on a nitride semiconductor substrate of the present invention.

FIG. 11 is a schematic perspective view showing an LD device having a structure similar to that shown in FIG. 10 except that a nitride semiconductor substrate 1000 supported on a support member 10 supports the LD device. In the LD device shown in FIG. 11, except for a ridge, a p-side cladding layer 218, a p-side light guide layer 217, a cap layer 216, an active layer 215, an n-side light guide layer 214, an n-side cladding layer 213, and a crack prevention layer 212 are etched to expose their side surfaces, thereby providing a rectangular parallelepiped structure. This etching reaches a portion in the surface of a buffer layer 211 to expose the surface portions of the buffer layer 211 on the two sides of the rectangular parallelepiped structure. N-side electrodes 223a and 223b are formed on the two exposed surface portions of the buffer layer 211 (in this case, the buffer layer 211 also serves as an n-side contact layer). Obviously, an insulating film 221 covers the exposed side surfaces of the p-side cladding layer 218, the p-side light guide layer 217, the cap layer 216, the active layer 215, the n-side light guide layer 214, the n-side cladding layer 213, and the crack prevention layer 212. When the substrate 1000 is doped with an n-type impurity, the buffer layer 211 may be completely etched by the above etching to expose the surface of the substrate 1000. In this case, the n-side electrodes 223a and 223b can be formed on the exposed surface of the substrate 1000. In addition, an n-side electrode may be formed on only one side of the above rectangular parallelepiped structure.

Figure 12:
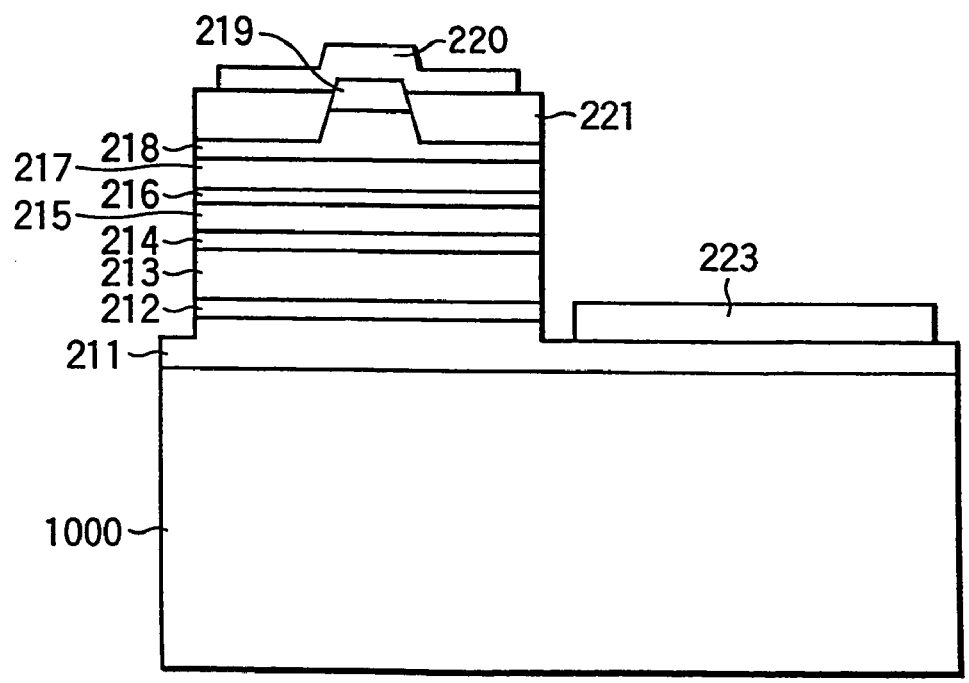
FIG. 12 is a sectional view schematically showing still another nitride semiconductor laser diode device supported on a nitride semiconductor substrate of the present invention.

FIG. 12 shows the structure of still another LD device according to the present invention. In the LD device shown in FIG. 12, an insulating film 221 is formed thick on the exposed surface of a p-side cladding layer 218 such that the top surface of a p-side contact layer 219 is exposed. This LD device has a structure similar to that of the LD device in FIG. 11 except that the pad electrode 222 is not formed because a p-side electrode 220 is formed, in contact with the p-side contact layer 219, on a wide region of the insulating film 221. In addition, in the LD device in FIG. 12, only one n-side electrode 223 is formed.

A nitride semiconductor as an element of the nitride semiconductor device structure of the present invention can be grown by using any of known methods suitable for the growth of a nitride semiconductor such as MOVPE, HVPE, and MBE. The MOVPE method is a preferable growth method. This method can grow an excellent crystal. However, since the MOCVD method takes a long period of time, a thicker nitride semiconductor layer is preferably formed by a method taking a relatively short period of time for crystal growth. In addition, nitride semiconductor portions are preferably grown by properly selecting various nitride semiconductor growth methods depending on the application purposes. In doping a nitride semiconductor with an n-type impurity or a p-type impurity, as is known well in this field, a Group IV element in the form of an organic compound or a hydride can be used as an n-type impurity, and a Group II element in the form of an organic compound can be used as a p-type impurity.

The present invention will be described below with reference to examples. In each of the following examples, MOVPE was performed under a reduced pressure of 50 to 400 Torr.

EXAMPLE 1

This example will be described with reference to FIGS. 1A to 1C.

First of all, a striped photomask was formed on a sapphire substrate 11, 2 inches in diameter, having a C plane as a major surface and an ORF surface forming an A plane, and 0.1-μm thick selective growth masks 13 made of many $SiO_2$ stripes having a stripe width of 10 μm and a stripe interval (width of each window) of 6 μm were formed by using a CVD apparatus. The respective stripe masks were formed to extend parallel in a direction perpendicular to the ORF surface.

The sapphire substrate 11, on which the selective growth masks 13 were formed, was set in an MOVPE reaction vessel. A low-temperature buffer layer (not shown) made of GaN was then grown on the substrate 11, on which the selective growth masks 11 were formed, to a thickness of about 200 angstroms at a temperature of 510° C. by using hydrogen as a carrier gas and ammonia and TMG as source gases. This low-temperature buffer layer was formed in only windows 14.

After the buffer layer was grown, only the flow of TMG was stopped (i.e., hydrogen carrier gas and ammonia were kept fed), and the temperature was raised to 1,050° C. At 1,050° C., a nitride semiconductor crystal substrate 16 made of GaN doped with Si at $1 \times 10^{18}/cm^3$ was grown to a thickness of 100 μm by using TMG and ammonia as source gases and silane gas as a dopant gas.

Subsequently, the wafer, on which the GaN crystal substrate was grown, was removed from the reaction vessel, and the surface of the GaN crystal substrate 16 was formed into a mirror surface by lapping.

COMPARATIVE EXAMPLE 1

For comparison, a GaN buffer layer was directly grown on a sapphire substrate as in Example 1 to a thickness of 200 angstroms, in the same manner as described above, without forming the selective growth masks 13. GaN doped with Si at $1 \times 10^{18}/cm^3$ was then grown on the buffer layer to a thickness of 100 μm in the same manner as described above.

When the number of lattice defects (crystal defects) per unit area in the GaN crystal obtained in Example 1 and that in the GaN crystal obtained in Comparative Example 1 were measured by two-dimensional TEM observation, the number of lattice defects in the GaN crystal in Example 1 was 1/10 or less that in Comparative Example 1.

EXAMPLE 2

This example will be described with reference to FIGS. 6A to 6C.

Second selective growth masks 113 having a stripe width of 10 μm and a stripe interval of 6 μm were grown on the surface of a GaN crystal 16 obtained as in Example 1 to a thickness of 0.1 μm in the same manner as in Example 1. The positions of the second selective growth masks 113 were shifted from those of first selective growth masks 13. More specifically, mask alignment was performed such that the respective stripes of the second selective growth masks 113 were located at positions corresponding to windows 14 of the first selective growth masks and extend parallel to the first selective growth masks 13.

The wafer, on which the second selective growth masks 113 were formed, was placed back into the MOVPE reaction vessel, and a GaN crystal 116 doped with Si at $1 \times 10^{18}/cm^3$ was grown to a thickness of 150 μm by using TMG and ammonia as source gases and silane gas as a dopant gas.

The wafer, on which the GaN crystal 116 was grown, was removed from the reaction vessel. The surface of the crystal was then mirror-polished, and the number of lattice defects (crystal defects) per unit area was measured by two-dimensional TEM observation in the same manner as in Example 1. The number of defects in the GaN crystal 116 in this example was 1/100 or less that in the GaN crystal in Comparative Example 1.

EXAMPLE 3

This example will be described with reference to FIGS. 1A to 1C and 6A to 6C.

A low-temperature buffer layer made of GaN was grown on a sapphire substrate 11 as in Example 1 to a thickness of 200 angstroms, and an undoped GaN layer was grown on the buffer layer to a thickness of 5 μm, thereby forming an underlayer 12 having a two-layer structure. First selective growth masks 13 made up of many $SiO_2$ stripes having a stripe width of 10 μm and a stripe interval of 8 μm were grown on the flat surface of the underlayer 12 of a support member 10, obtained in this manner, to a thickness of 0.1 μm by the same method as in Example 1. The first selective growth masks 13 extended parallel in a direction perpendicular to the sapphire A plane.

The wafer, on which the first selective growth masks 13 were formed, was moved into the MOVPE reaction vessel. An undoped GaN crystal 16 was then grown on the wafer to a thickness of 10 μm at 1,050° C. by using TMG and ammonia as source gases.

The wafer, on which the GaN crystal 16 was grown, was removed from the reaction vessel, and the surface of the GaN crystal 16 was formed into a mirror surface by lapping. Second selective growth masks 113 made up of many $Si_3N_4$ stripes having a stripe width of 12 μm and a stripe interval of 6 μm were grown on the surface of this GaN crystal 16 to a thickness of 0.1 μm by the same method as in Example 1. The respective second strip masks were formed at positions corresponding to windows 14 of the first selective growth masks.

The wafer, on which the second selective growth masks 113 were formed, was placed back into the MOVPE reaction vessel, and an undoped GaN crystal 116 was grown to a thickness of 150 μm. The number of crystal defects in the obtained undoped GaN crystal 116 was almost equal to that in the GaN crystal in Example 2.

EXAMPLE 4

An Si-doped GaN crystal 16 was grown to a thickness of 100 μm by the same method as in Example 1 except that a sapphire substrate having an A plane as a major surface and an ORF surface forming an R plane was used, and silicon dioxide stripe masks were formed to extend in a direction perpendicular to the R plane. The number of crystal defects in this GaN crystal 16 was almost equal to that in the GaN crystal in Example 1.

EXAMPLE 5

This example will be described with reference to FIGS. 1A to 1C.

A spinnel substrate 11, 1 inch in diameter, having a (211) plane as a major surface and an ORF surface forming a (110) plane was prepared. First selective growth masks 13 made up of many $SiO_2$ stripes were formed on the surface of this spinnel substrate 11 to extend in a direction perpendicular to the ORF surface. The stripe width was 12 μm, and the stripe interval was 6 μm.

A quartz boat having Ga metal accommodated in a quartz reaction vessel was placed in the HVPE apparatus. The spinnel substrate 11, on which the first selective growth masks 13 were formed, was tilted at a position apart from the quartz boat. A halogen gas feed pipe was placed near the Ga metal in the reaction vessel, and a nitrogen source feed pipe was placed near the substrate 11.

HCl gas was fed into the reaction vessel, together with a nitrogen carrier gas, through the halogen gas feed pipe. In this case, the boat accommodating the Ga metal was heated to 900° C., and the spinnel substrate was heated to 1,050° C. The HCl gas was then caused to react with the Ga metal to produce $GaCl_3$. Ammonia gas was fed into the reaction vessel, together with a nitrogen carrier gas, through the nitrogen source feed pipe near the spinner substrate 11, and silane gas was fed, together with hydrogen chloride gas, through the halogen gas feed pipe. Crystal growth was then performed for 3 hours at a growth rate of 50 μm/h. As a result, a GaN crystal 16 doped with Si at $1 \times 10^{18}/cm^3$ was grown to a thickness of 150 μm.

The wafer, on which the HVPE gallium nitride crystal 16 was grown, was removed from the reaction vessel. The uneven portions on the surface of the GaN crystal 16 were removed by lapping, and the number of lattice defects was measured. The number of defects in the GaN crystal 16 obtained in this example was equal to that in the GaN crystal in Example 1.

EXAMPLE 6

This example will be described with reference to FIGS. 8A and 8B.

A wafer having the Si-doped GaN crystal obtained in Example 1 was set in the reaction vessel of the MOVPE apparatus, and a high-temperature buffer layer 81 made of GaN doped with Si at $1 \times 10^{18}/cm^3$ was grown on the Si-doped GaN crystal to a thickness of 1 μm at 1,050° C.

Subsequently, a 20-angstroms thick active layer 82 made of $In_{0.4}Ga_{0.6}N$ and having a single quantum well structure, a 0.3-μm thick p-side cladding layer 83 made of Mg-doped $Al_{0.2}Ga_{0.8}N$, and a 0.5-μm thick p-side contact layer 84 made of Mg-doped GaN were sequentially grown on the high-temperature buffer 81 by MOVPE.

After this step, the wafer was removed from the reaction vessel and annealed in a nitrogen atmosphere at 600° C. to reduce the resistances of the p-side cladding layer 83 and the p-side contact layer 84.

Etching was sequentially performed from the p-side contact layer 84 to partly expose the Si-doped GaN crystal. This etching provides a "cutting margin" in a subsequent scribing process.

After etching, a 200-angstroms thick light-transmitting p-side electrode 85 having a two-layer structure made of Ni/Au was formed on almost the entire surface of the p-side contact layer 84. A 0.5-μm thick pad electrode 86 for bonding was formed on the p-side electrode 85.

After the pad electrode 86 was formed, a sapphire substrate 11 of the wafer, a low-temperature buffer layer 12, and first selective growth masks 13 (see FIG. 1C) were removed by polishing to expose the lower surface of an Si-doped GaN crystal 16. A 0.5-μm thick n-side electrode 87 was formed on almost the entire lower surface.

Subsequently, scribing was performed from the n-electrode side along the above cutting margin to cleave the M plane ((1100) plane) of the Si-doped GaN crystal 16 from a plane perpendicular to the M plane, thereby obtaining a 300-μm square LED chip. This LED emitted 520-nm green light with 20 mA. The output level and electrostatic breakdown voltage of the LED were twice or more those of the LED device grown on a conventional sapphire substrate. That is, this device exhibited excellent characteristics.

EXAMPLE 7

This example will be described with reference to FIG. 10.

A wafer, on which an Si-doped GaN crystal 116 obtained in as Example 2 was grown, was set in the MOVPE reaction vessel of the MOVPE apparatus, and a high-temperature buffer layer 211 made of GaN doped with Si at $1 \times 10^{18}/cm^3$ was grown on the Si-doped GaN crystal 116 to a thickness of 1 μm at 1,050° C.

A crack prevention layer 212 made of $In_{0.1}Ga_{0.9}N$ doped with Si at $5 \times 10^{18}/cm^3$ was grown on the high-temperature buffer layer 211 to a thickness of 500 angstroms.

An n-side cladding layer 213 having a total thickness of 0.4 μm and a superlattice structure was formed on the crack prevention layer 212 by alternately stacking a total of 100 20-angstroms thick first layers, each made of n-type $Al_{0.2}Ga_{0.8}N$ doped with Si at $5 \times 10^{18}/cm^3$, and 20-angstroms thick second layers, each made of undoped GaN.

An n-side light guide layer 214 made of n-type GaN doped with Si at $5 \times 10^{18}/cm^3$ was grown on the n-side cladding layer 213 to a thickness of 0.1 μm.

Subsequently, 25-angstroms thick well layers made of undoped $In_{0.2}Ga_{0.8}N$ and 50-angstroms thick barrier layers made of undoped $In_{0.01}Ga_{0.95}N$ were alternately stacked to form an active layer 215 having a total thickness of 175 angstroms and a multi quantum well (MQW) structure.

A p-side cap layer 216 made of p-type $Al_{0.3}Ga_{0.9}N$ doped with Mg at $1 \times 10^{20}/cm^3$ and having a band gap energy higher than that of a p-side light guide layer 217 and that of the active layer 215 was grown to a thickness of 300 angstroms.

The p-side light guide layer 217 made of p-type GaN doped with Mg at $1 \times 10^{20}/cm^3$ and having a band gap energy higher than that of the p-side cap layer 216 was grown on the p-side cap layer 216 to a thickness of 0.1 μm.

Subsequently, 20-angstroms thick first layers made of p-type $Al_{0.2}Ga_{0.8}N$ doped with Mg at $1 \times 10^{20}/cm^3$ and 20-angstroms thick second layers made of p-type GaN doped with Mg at $1 \times 10^{20}/cm^3$ were alternately stacked on the p-side light guide layer 217 to form a p-side cladding layer 218 having a total thickness of 0.4 μm and a super-lattice structure.

Finally, a p-side contact layer 219 made of p-type GaN doped with Mg at $2 \times 10^{20}/cm^3$ was grown to a thickness of 150 angstroms.

After all the nitride semiconductor layers were grown, the wafer was annealed in a nitrogen atmosphere at 700° C. in the reaction vessel, thereby further decreasing the resistance of each p-type layer. After annealing, the wafer was removed from the reaction vessel, and the p-side contact layer 219 as the uppermost layer and the p-side cladding layer 218 were etched by using an RIE apparatus, so that a 4-μm wide striped ridge was formed. A p-side electrode 220 having a two-layer structure made of Ni/Au was formed on the entire top surface of the ridge. An insulating film 221 made of $SiO_2$ was formed on the exposed side surfaces of the p-side cladding layer 218 and the contact layer 219 except for the p-side electrode 220. A p-side pad electrode 222 electrically connected to the p-side electrode 220 was formed through this insulating film 221.

After the p-side pad electrode 222 was formed, a sapphire substrate 11 of the wafer, a buffer layer 12, first selective growth masks 13, a first GaN crystal 16, second selective growth masks 113, and part of the second GaN crystal 116 were removed by polishing to expose the lower surface of the second GaN crystal. A 0.5-μm thick n-side electrode 223 having a two-layer structure made of Ti/Al was formed on the entire lower surface of the second GaN crystal. A thin Au/Sn film for metallization for a heat sink was formed on the n-side electrode 223.

Subsequently, the wafer was scribed from the n-side electrode 223 to cleave the second GaN crystal 116 in the form of a bar from the M plane ((1$\bar{1}$00) plane) of the second GaN crystal 116 corresponding to a side surface of a hexagonal prism in FIG. 3, thereby manufacturing a resonance surface. A dielectric multilayer film made of $SiO_2$ and $TiO_2$ was formed on this resonance surface. Finally, the bar was cut in a direction parallel to the extending direction of the p-side electrode 220 to obtain laser chips. When the LD device product obtained by placing the respective chips on the heat sink with the chips facing up (in a state wherein the substrate faces the heat sink), and performing wire bonding for the p-side pad 222 was laser-oscillated at room temperature, continuous oscillation of an oscillation wavelength of 405 nm was observed at room temperature, a threshold current density of 2.0 $kA/cm^2$, and a threshold voltage of 4.0V. This product exhibited an oscillation life of 1,000 hrs or more.

EXAMPLE 8

This example will be described with reference to FIG. 9.

On an undoped GaN crystal 116 obtained as in Example 2, a high-temperature buffer layer 81 made of GaN doped with Si at $1 \times 10^{18}/cm^3$, a 20-angstroms thick active layer 82 made of $In_{0.4}Ga_{0.6}N$ and having a single quantum well structure, a 0.3-μm thick p-side cladding layer 83 made of $Al_{0.2}Ga_{0.8}N$ doped with Mg, and a 0.5-μm thick p-side contact layer 84 made of Mg-doped GaN were sequentially grown by the same method as in Example 6. A light-transmitting p-side electrode 85 was formed on almost the entire surface of the p-side contact layer 84 in the same manner as in Example 6. A pad electrode 86 was formed on the p-electrode 85. After a predetermine etching step, an n-side electrode 87 was formed on the high-temperature buffer layer 81.

The LED device of this example differs from the LED device of Example 6 in that the LED device structure of this example is formed on the second GaN crystal 116 having better crystallinity than the GaN crystal 116 of Example 1, and the p-side electrode 85 and the n-side electrode 87 are formed on the same surface side of the substrate. In a nitride semiconductor device having a structure in which a nitride semiconductor doped with an n-type impurity (high-temperature buffer layer 81) is stacked on an undoped GaN crystal substrate in this manner, when an n-electrode is formed on the n-type layer side, an LED device with low Vf and high emission efficiency tends to be easily obtained by forming the n-electrode on the nitride semiconductor layer doped with an n-type impurity. In fact, both the output level and electrostatic breakdown voltage of the LED device of Example 8 increased about 1.5 times those of the LED device of Example 6.

EXAMPLE 9

This example will be described with reference to FIGS. 1A to 1C and 9.

Similar to Example 3, a 200-angstroms thick low-temperature buffer layer made of GaN and a 4-μm thick undoped GaN layer were grown on a sapphire substrate 11 having a C plane as a major surface and an ORF surface forming an A plane so as to form a underlayer 12 having a two-layer structure. First selective growth masks made up of many $SiO_2$ stripes having a stripe width of 20 μm and a stripe interval of 5 μm were grown on the undoped GaN layer to a thickness of 0.1 μm by using a CVD apparatus. The first selective growth masks extended parallel in a direction perpendicular to the ORF structure.

This wafer was transferred to the MOVPE apparatus, and a GaN crystal doped with Si at $1\times10^{19}/cm^3$ was grown to a thickness of 15 μm.

Subsequently, in the same manner as in Example 8, a high-temperature buffer layer made of GaN doped with Si at $1\times10^{18}/cm^3$, a 20-angstroms thick $In_{0.4}Ga_{0.6}N$ active layer having a single quantum well structure, a 0.3-μm thick p-side cladding layer made of Mg-doped $Al_{0.2}Ga_{0.8}N$, and a 0.5-μm thick p-side contact layer made of Mg-doped GaN were sequentially grown on the Si-doped GaN crystal. Thereafter, etching was performed from the p-side cladding layer to expose the surface of the Si-doped GaN crystal having a high impurity concentration, and an n-side electrode was formed on the exposed surface. A light-transmitting p-side electrode was formed on almost the entire surface of the p-side contact layer. A pad electrode for bonding was formed on the p-side electrode. As described above, in this LED device, the n- and p-side electrodes were formed on the same surface of the substrate. Finally, the sapphire substrate was thinned to a thickness of about 50 μm by polishing, and scribing was performed on the polished surface side to obtain a 350-μm square LED device. This LED device exhibited characteristics almost equivalent to those of the LED device of Example 6, but the yield of device itself was 100 times or more that in Example 6.

EXAMPLE 10

This example will be described with reference to FIGS. 1A to 1C, 2, and 9.

A sapphire substrate 11, 2 inches diameter, having an off angle θ=0.13° from the C plane, a step difference of about 15 angstroms, steps each having a terrace width W of about 56 angstroms, and an ORF surface forming an A plane was prepared.

Similar to Example 9, a low-temperature buffer layer made of GaN was grown on the off-angled surface of this sapphire substrate to a thickness of 200 angstroms, and an undoped GaN layer was grown on the buffer layer to a thickness of 4 μm to form an underlayer 12 having a two-layer structure. Thereafter, first selective growth masks 13 made up of many $SiO_2$ stripes having a stripe width of 25 μm and a stripe interval of 5 μm were grown on this undoped GaN layer to a thickness of 0.1 μm. The first selective growth masks extended parallel in a direction perpendicular to the A plane.

This wafer was transferred to the MOVPE apparatus, and a GaN crystal doped with Si at $1\times10^{19}/cm^3$ was grown on the wafer to a thickness of 10 μm.

A high-temperature buffer layer made of GaN doped with Si at $1\times10^{18}/cm^3$, a 20-angstroms thick $In_{0.4}Ga_{0.6}N$ active layer having a single quantum well structure, a 0.3-μm thick p-side cladding layer made of Mg-doped $Al_{0.2}Ga_{0.8}N$, and 0.5-μm thick a p-side contact layer made of Mg-doped GaN were sequentially grown on the Si-doped GaN crystal.

Subsequently, a 350-μm square LED device was obtained by performing the same processing as that in Example 9. The output level of this LED device improved 5% as compared with the LED device of Example 9, and the yield of the device itself was high as in Example 9.

EXAMPLE 11

After a GaN crystal doped with Si at $1\times10^{19}/cm^3$ was grown to a thickness of 10 μm following the same procedure as in Example 9, the wafer was removed from the reaction vessel of the MOVPE apparatus, and 0.1-μm thick second selective growth masks made up of silicon dioxide stripes, each having a stripe width of 15 μm, were formed at positions corresponding to the window portions of the first selective growth masks. The wafer, on which the second selective growth masks were formed, was transferred to the MOVPE apparatus, and a second GaN crystal 116 doped with Si at $1\times10^{19}/cm^3$ was grown to a thickness of 15 μm.

Subsequently, in the same manner as in Example 9, a high-temperature buffer layer made of GaN doped with Si at $1\times10^{18}/cm^3$, a 20-angstroms thick $In_{0.4}Ga_{0.6}N$ active layer having a single quantum well structure, a 0.3-μm thick p-side cladding layer made of Mg-doped $Al_{0.2}Ga_{0.8}N$, and a 0.5-μm thick p-side contact layer made of Mg-doped GaN were sequentially grown on the second Si-doped GaN crystal 116. Thereafter, a 350-μm square LED device was obtained by following the same procedure as in Example 9. This LED device exhibited almost the same characteristics as those of the LED device of Example 8. The yield of the device itself was 100 times or more that in Example 8.

EXAMPLE 12

This example will be describe with reference to FIGS. 8A and 8B, in particular.

A sapphire substrate 11 having a C plane as a major surface and an ORF surface forming an A plane was set in the reaction vessel of the MOVPE apparatus, and a low-temperature buffer layer made of GaN was grown on the sapphire substrate 11 to a thickness of 200 angstroms at 500° C. Thereafter, the temperature in the reaction vessel was set to 1,050° C. to grow a GaN layer to a thickness of 5 μm, thereby forming an underlayer 12 having a two-layer structure.

This wafer was removed from the reaction vessel. Stripe photomasks were then formed on the top surface of the underlayer 12. Selective growth masks 13 made up of many $SiO_2$ stripes having a stripe width of 20 μm and a stripe interval (width of each window) of 5 μm were formed to have a thickness of 0.1 μm by using a CVD apparatus. The respective stripe masks extended parallel in a direction perpendicular to the ORF surface.

The wafer, on which the first selective growth masks 13 were formed, was set in the MOVPE reaction vessel again, and a GaN crystal 16 doped with Si at $1\times10^{18}/cm^3$ was grown to a thickness of 100 μm at 1,050° C.

The wafer, on which the Si-doped GaN crystal 16 was grown, was removed from the MOVPE reaction vessel, and the surface of the Si-doped GaN crystal 16 was formed into a mirror surface by lapping. The number of crystal defects in the surface region, of this Si-doped GaN crystal 16, which corresponds to each first selective growth mask 13 was $10^6/cm^2$ or less.

The wafer, on which the Si-doped GaN crystal 16 was grown, was transferred to the MOVPE reaction vessel again, and a buffer layer (n-side cladding layer) 81 made of GaN doped with Si at $1\times10^{18}/cm^3$ was grown on the Si-doped GaN crystal 16 to a thickness of 1 μm.

Subsequently, a 20-angstroms thick undoped $In_{0.4}Ga_{0.6}N$ active layer 82 having a single quantum well structure, a 0.3-μm thick p-side cladding layer 83 made of $Al_{0.2}Ga_{0.8}N$ doped with Mg at $1\times10^{20}/cm^3$, and a 0.5-μm thick p-side contact layer 84 made of GaN doped with Mg at $1\times10^{20}/cm^3$ were sequentially grown on the n-side cladding layer 81.

After this step, the wafer was removed from the MOVPE reaction vessel and annealed in a nitrogen atmosphere at 600° C. to reduce the resistances of the p-side cladding layer 83 and the p-side contact layer 84. Etching was then performed from the p-side contact layer 84 to expose the surface of the n-side cladding layer 81 or the GaN crystal 16, and a cutting margin was formed.

After the etching step, a 200-angstroms thick light-transmitting p-side electrode 85 having a two-layer structure made of Ni/Au was formed on almost the entire surface of the p-side contact layer 84, and a 0.5-μm thick p-side pad electrode 86 for bonding was formed on the p-electrode 85.

After the p-side pad electrode 86 was formed, the sapphire substrate 11 of the wafer, the underlayer 12, and the first selective growth masks 13 were removed by polishing to expose the lower surface of the GaN crystal 16, and a 0.5-μm thick n-side electrode 87 having a two-layer structure made of W/Al was formed on almost the entire lower surface.

Subsequently, the wafer was cut along the cutting margin into a bar, and the bar was cut in a direction perpendicular to a short side of the bar to obtain an LED chip. The crystal defects in the nitride semiconductor layer under the active layer of this LED chip were few in a portion on each first selective growth mask, and were many in a portion on each window portion. A highly reliable device can therefore be obtained by setting a large area of the active layer in the regions having few crystal defects. The LED obtained in this example emitted 520-nm green light with 20 mA. The output level and electrostatic breakdown voltage of the LED were twice or more those of a nitride semiconductor device structure grown on a conventional sapphire substrate. That is, this device exhibited excellent characteristics.

In this example, each first selective growth mask was in the form of a stripe. However, selective growth masks may be formed in advance to have a regular dot pattern in accordance with the shape of each chip to be cut (e.g., a rectangular shape), and chips may be cut at positions corresponding to the window portions of the selective growth masks.

EXAMPLE 13

This example will be described with reference to FIG. 11, in particular.

A GaN crystal 16 doped with Si at $1\times10^{18}/cm^3$ was grown to a thickness of 6 μm by the same method as in Example 12.

The wafer, on which this GaN crystal 16 was grown, was set in the MOVPE reaction vessel, and a high-temperature buffer layer 211 made of GaN doped with Si at $1\times10^{18}/cm^3$ was grown on this Si-doped GaN crystal 15 at 1,050° C.

A crack prevention layer 212 made of $In_{0.1}Ga_{0.9}N$ doped with Si at $5\times10^{18}/cm^3$ was grown on the high-temperature buffer layer 211 to a thickness of 500 angstroms.

Subsequently, a total of 10 20-angstroms thick first layers made of n-type $Al_{0.2}Ga_{0.8}N$ doped with Si at $5\times10^{18}/cm^3$ and 20-angstroms thick second layers made of undoped GaN were alternately stacked on the crack prevention layer 212 to form an n-side cladding layer 213 having a total thickness of 0.4 μm and a superlattice structure.

An n-side light guide layer 214 made of n-type GaN doped with Si at $5\times10^{18}/cm^3$ was grown to a thickness of 0.1 μm.

Twenty-five-angstroms thick well layers made of undoped $In_{0.2}Ga_{0.8}N$ and 50-angstroms thick barrier layers made of undoped $In_{0.01}Ga_{0.99}N$ were alternately stacked on the n-side light guide layer 214 to form an active layer 215 having a total thickness of 175 angstroms and a multi quantum well (MQW) structure.

A p-side cap layer 216 made of p-type $Al_{0.3}Ga_{0.7}N$ doped with Mg at $1\times10^{20}/cm^3$ and having a band gap energy higher than that of a p-side light guide layer 217 and that of the active layer 215 was grown on the active layer 215 to a thickness of 300 angstroms.

The p-side light guide layer 217 made of p-type GaN doped with Mg at $1\times10^{20}/cm^3$ and having a band gap energy lower than that of the p-side cap layer 216 was grown on the p-side cap layer 216 to a thickness of 0.1 μm.

Twenty-angstroms thick first layers made of p-type $Al_{0.2}Ga_{0.8}N$ doped with Mg at $1\times10^{20}/cm^3$ and 20-angstroms thick second layers made of p-type GaN doped with Mg at $1\times10^{20}/cm^3$ were alternately stacked on the p-side light guide layer 217 to grow a p-side cladding layer 218 having a total thickness of 0.4 μm and a superlattice structure.

Finally, a p-side contact layer 219 made of p-type GaN doped with Mg at $2\times10^{20}/cm^3$ was grown to a thickness of 150 angstroms.

After all the nitride semiconductor layers were grown, the wafer was annealed in a nitrogen atmosphere at 700° C. in the reaction vessel to further decrease the resistance of each p-type layer. After the annealing step, the wafer was removed from the reaction vessel, and the p-side contact layer 219 as the uppermost layer and the p-side cladding layer 218 were etched by using an RIE apparatus to form a ridge having a stripe with of 4 μm. The ridge was formed above the first selective growth masks in a direction parallel to the stripes of the first selective growth masks.

After the ridge was formed, the portions, of the p-side light guide layer 217, which were exposed on the two sides of the ridge stripe were etched to expose the surface portions, of the n-side cladding layer 211, on which n-side electrodes 223a and 223b were to be formed.

After this step, a p-side electrode 220 having a two-layer structure made of Ni/Au was formed on the entire top surface of the ridge. An insulating film 221 made of $SiO_2$ was formed on the surfaces of the p-side cladding layer 218 and the p-side contact layer 219 except for the p-side electrode 220. A p-side pad electrode 222 electrically connected to the p-side electrode 220 through the insulating film 221 was formed. The n-side electrodes 223a and 223b having a two-layer structure made of W/Al were formed on the exposed surfaces of the n-side cladding layer 211.

After the n-side electrode was formed, the sapphire substrate of the wafer was polished to a thickness of 50 μm in the same manner as in Example 1. Thereafter, the active layer 215 was cleaved from the sapphire substrate 11 in a direction perpendicular to the p-side electrode 220 and the n-side electrodes 223a and 223b in the form of stripes, thereby making the cleavage surface of the active layer 215 serve as a resonance surface. The GaN crystal 16 includes regions having many crystal defects and regions having few crystal defects. In an LD device, the n-side electrodes 223a and 223b were formed on the regions having many crystal defects to omit the active layer 215. Since this eliminates the possibility that the active layer 215 on which heat concentrates is destroyed by crystal defects, a highly reliable LD device having a long service life can be realized.

When the LD device obtained in this example was laser-oscillated at room temperature, continuous oscillation of an oscillation wavelength of 405 nm was observed at a threshold current density of 2.0 kA/cm$^2$ and a threshold voltage of 4.0V. This product exhibited an oscillation life of 1,000 hrs or more.

EXAMPLE 14

This example will be described with reference to FIGS. 1A to 1C, in particular.

First of all, a striped photomask was formed on a sapphire substrate 11, 2 inches in diameters, having a C plane as a major surface and an ORF surface forming an A plane by the same method as in Example 1, and first selective growth masks 13 made up of many $SiO_2$ stripes having a stripe width of 10 μm and a stripe interval (window 14) of 5 μm were grown to a thickness of 1 μm. The respective stripes 13 extended in a direction perpendicular to the ORF surface of the sapphire substrate 11.

The sapphire substrate 11, on which the first selective growth masks 13 were formed, was set in the MOVPE reaction vessel, and a low-temperature buffer layer (not shown) made of GaN was grown on the substrate 1, on which the selective growth masks 13 were formed, to a thickness of about 20 angstroms by setting a temperature of 510° and using hydrogen as a carrier gas and ammonia and TMG as source gases.

After the buffer layer was grown, only the flow of TMG was stopped, and the temperature was raised to 1,050° C. A GaN crystal 16 doped with Si at $1\times10^{18}/cm^3$ was grown to a thickness of 100 μm at 1,050° C. by using TMG and ammonia as source gases and silane gas as a dopant gas.

After this step, the wafer on which the GaN crystal 16 was grown was removed from the reaction vessel, and the surface of the GaN crystal (substrate) 16 was formed into a mirror surface by lapping.

The number of crystal defects in the GaN crystal obtained in Example 14 and that in the GaN crystal obtained in Comparative Example 1 were measured by two-dimensional TEM observation. As a result, the average number of crystal defects in the GaN crystal obtained in Example 14 was $1.3\times10^6/cm^2$, and that in the GaN crystal in Comparative Example 1 was $2.4\times10^7/cm^2$. The number of crystal defects in the GaN crystal of Example 14 was 1/10 or less that in the GaN crystal in Comparative Example 1.

EXAMPLE 15

This example will be described with reference to FIGS. 1A to 1C.

A low-temperature buffer layer made of GaN was grown on the sapphire substrate 11 used in Example 14 to a thickness of 200 angstroms, and an undoped GaN layer was grown on the buffer layer to a thickness of 5 μm, thereby forming an underlayer 12 having a two-layer structure. One-μm thick first selective growth masks 13 made up of many $SiO_2$ stripes having a stripe width of 10 μm and a stripe interval of 3 μm were formed on the top surface of the underlayer 12 of this wafer by the same method as in Example 14. The respective stripes 13 extended in a direction perpendicular to the ORF surface of the sapphire substrate 11.

The wafer, on which the selective growth masks 13 were formed, was transferred to the HVPE reaction vessel, and an Si-doped GaN crystal 16 was grown on the wafer to a thickness of 300 μm at 1,050° C. by using $GaCl_3$ and ammonia as source gases and silane gas as a dopant gas.

The wafer, on which the GaN crystal 16 was grown, was removed from the reaction vessel. The sapphire substrate 11, the underlayer 12, and the sapphire substrate 11 were removed by polishing, and the lower surface of the GaN crystal 16 was mirror-finished, thereby obtaining an Si-doped GaN crystal substrate.

As in Example 14, when the number of crystal defects in the surface of the substrate on the opposite side to the polished surface was measured, the number was $1\times10^3/cm^2$, which was smaller than that in the GaN crystal of Example 14. That is, a device manufacturing substrate having very good crystallinity was obtained.

EXAMPLE 16

An Si-doped GaN crystal 16 was grown to a thickness of 100 μm by the same method as in Example 14 except that the sapphire substrate 11 having an A plane as a major surface and an ORF surface forming an R plane was used as the dissimilar substrate 11. Note that stripes 13 extended in a direction perpendicular to the R plane. As a result, the GaN crystal 16 having very few etching pits, which were almost equal in number to those in Example 1, was obtained.

EXAMPLE 17

A spinner substrate 11, 1 inch in diameter, having a (111) plane as a major surface and a (110) plane forming an ORF surface was prepared. One-μm thick first selective growth masks 13 made up of many $SiO_2$ stripes were formed on the surface of this spinnel substrate 1 to extend in a direction perpendicular to the ORF surface by the same method as in Example 1. The strip width was 10 μm, and the stripe interval was 3 μm.

A GaN crystal 16 doped with Si at $1\times10^{18}/cm^3$ was grown on the spinnel substrate 11, on which the selective growth masks 13 were formed, to a thickness of 150 μm by the same HVPE method as that in Example 5.

The wafer, on which the Si-doped GaN crystal was grown, was removed from the reaction vessel, and the spinnel substrate 11 and the selective growth masks 13 were removed by lapping. When the number of crystal defects in the resultant structure was measured in the same manner as in Example 14, the GaN crystal obtained in this example was a crystal having very few etching pits almost equal in number to those in Example 14.

EXAMPLE 18

This example will be described with reference to FIGS. 8A and 8B, in particular.

A sapphire substrate 11, a low-temperature buffer layer, and selective growth masks 13 were removed from a wafer obtained as in Example 14 by polishing so as to expose the lower surface of the Si-doped GaN crystal, thereby obtaining an Si-doped GaN crystal substrate 1000 in a free state.

This Si-doped GaN crystal substrate 1000 was set in the reaction vessel of the MOVPE apparatus, and a high-temperature buffer layer 81 made of GaN doped with Si at $1 \times 10^{18}/cm^3$ was grown on the surface of the substrate at 1,050° C.

A 20-angstroms thick $In_{0.4}Ga_{0.6}N$ active layer 82 having a single quantum well structure, a 0.3-µm p-side cladding layer 83 made of $Al_{0.2}Ga_{0.8}N$ doped with Mg at $1 \times 10^{20}/cm^3$, and a 0.5-µm thick p-side contact layer 84 made of GaN doped with Mg at, $1 \times 10^{20}/cm^3$ were sequentially grown on the high-temperature buffer layer 81.

The wafer, on which the respective nitride semiconductor layers were grown, was removed from the reaction vessel and was annealed in a nitrogen atmosphere at 600° C. to decrease the resistances of the p-side cladding layer 83 and the p-side contact layer 84. Thereafter, etching was performed from the p-side contact layer 34 side to expose the upper surface of the Si-doped GaN crystal substrate 1000. With this etching step, a "cutting margin" for chip cutting was formed.

After the above etching step, a 200-angstroms thick light-transmitting p-side electrode 85 having a two-layer structure made of Ni/Au was formed on almost the entire upper surface of the p-side contact layer 84. A 0.5-µm thick pad electrode 86 for bonding was formed on the p-side electrode 85.

After the pad electrode was formed, a 0.5-µm thick n-side electrode 87 was formed on the entire lower surface of the GaN crystal substrate 1000.

After this step, scribing was performed from the n-electrode side along the above cutting margin to cleave the M plane (($1\overline{1}00$) plane) of the GaN crystal substrate 1000 from a surface perpendicular to the M plane, thereby obtaining a 300-µm square LED chip. This LED emitted 520-nm green light with 20 mA. The output level and electrostatic breakdown voltage of the LED were twice or more those of a device obtained by growing a nitride semiconductor device structure on a conventional sapphire substrate. That is, this device exhibited excellent characteristics.

EXAMPLE 19

This example will be described with reference to FIG. 10.

An Si-doped GaN crystal substrate 1000 in a free state, obtained as in Example 18, was set in the reaction vessel of the MOVPE apparatus, and an n-side cladding layer 213 was directly formed on the upper surface of this substrate 1000 without forming a buffer layer 211 and a crack prevention layer 212. More specifically, a total of 100 20-angstroms thick first layers made of n-type $Al_{0.2}Ga_{0.8}N$ doped with Si at $1 \times 10^{19}/cm^3$ and 20-angstroms thick second layers made of undoped GaN were alternately grown to form an n-side cladding layer 213 having a total thickness of 0.4 µm and a superlattice structure.

An n-side light guide layer 214 made of n-type GaN doped with Si at $1 \times 10^{17}/cm^3$ was grown on the n-side cladding layer 213 to a thickness of 0.1 µm.

Subsequently, 25-angstroms thick well layers made of $In_{0.2}Ga_{0.8}N$ doped with Si at $1 \times 10^{17}/cm^3$ and 50-angstroms thick barrier layers made of $In_{0.01}Ga_{0.95}N$ doped with Si at $1 \times 10^{17}/cm^3$ were alternately stacked on the n-side light guide layer 214 to form an active layer 215 having a total thickness of 175 angstroms and a multi quantum well (MQW) structure.

A p-side cap layer 216 made of $Al_{0.3}Ga_{0.9}N$ doped with Mg at $1 \times 10^{20}/cm^3$ and having a band gap energy higher than that of the p-side light guide layer 217 and that of the active layer 215 was grown on the active layer 215 to a thickness of 300 angstroms.

Subsequently, a p-side light guide layer 217 made of p-type GaN doped with Mg at $1 \times 10^{18}/cm^3$ and having a band gap energy lower than that of the p-side cap layer 216 was grown on the p-side cap layer 216 to a thickness of 0.1 µm.

Twenty-angstroms thick first layers made of p-type $Al_{0.2}Ga_{0.8}N$ doped with Mg at $1 \times 10^{20}/cm^3$ and 20-angstroms thick second layers made of p-type GaN doped with Mg at $1 \times 10^{20}/cm^3$ were alternately stacked on the p-side light guide layer 217 to form a p-side cladding layer 218 having a total thickness of 0.4 µm and a superlattice structure.

Finally, a p-side contact layer 219 made of p-type GaN doped with Mg at $2 \times 10^{20}/cm^3$ was grown on the p-side cladding layer 218 to a thickness of 150 angstroms.

The wafer, on which the respective nitride semiconductor layers were formed in this manner, was annealed in a nitrogen atmosphere at 700° C. to further decrease the resistance of each p-type layer. After the annealing step, the wafer was removed from the reaction vessel, and the p-side contact layer 219 as the uppermost layer and the p-side cladding layer 218 were etched by using the RIE apparatus to provide a ridge having a stripe width of 4 µm. A p-side electrode 220 having a two-layer structure made of Ni/Au was formed on the entire top surface of the ridge. Thereafter, an insulating film 221 made of $SiO_2$ was formed on the exposed side surface of the p-side electrode 220 and the exposed surfaces of the p-side cladding layer 218 and the contact layer 219 except for the top surface of the p-side electrode 220. A p-side pad electrode 222 electrically connected to the p-side electrode 220 through the insulating film 221 was formed.

After the p-side pad electrode 222 was formed, a 0.5-µm thick n-side electrode 223 having a two-layer structure made of Ti/Al was formed on the entire lower surface of the Si-doped GaN crystal substrate 1000. A thin film made of Au/Sn was formed for metallization for a heat sink on the n-side electrode 223.

Subsequently, the wafer was scribed from the n-side electrode 223 to cleave the GaN crystal substrate 1000 along the M plane (($1\overline{1}00$) plane); corresponding to a side surface of the hexagonal prism in FIG. 3) of the GaN crystal substrate 1000 to provide a resonance surface and obtain a bar. A dielectric multilayer film made of $SiO_2$ and $TiO_2$ was formed on both or one of the resonance surfaces of this bar. Finally, the bar was cut in a direction parallel to the extending direction of the p-side electrode 220 to obtain an LD device chip. This chip was placed on the heat sink with the chip facing up, and the p-side pad electrode 222 was bonded thereto by wire bonding. When this LD device was laser-oscillated at room temperature, continuous oscillation of an oscillation wavelength of 405 m was observed at a threshold current density of 2.0 kA/cm$^2$ and a threshold voltage of 4.0V. The device exhibited a life of 1,000 hrs or more.

EXAMPLE 20

This example will be described with reference to FIG. 9, in particular.

A total of 100 20-angstroms thick first layers made of n-type $Al_{0.2}Ga_{0.8}N$ doped with Si at $1\times10^{19}/cm^3$ and 20-angstroms second layers made of undoped GaN were alternately grown on an undoped GaN crystal 16 (supported on sapphire substrate 11) obtained as in Example 15 to form an n-side cladding layer 81 having a total thickness of 0.4 µm and a superlattice structure.

A 20-angstroms thick $In_{0.4}Ga_{0.6}N$ having a single quantum well structure, a 0.3-µm thick p-side cladding layer 83 made of $Al_{0.2}Ga_{0.8}N$ doped with Mg at $1\times10^{20}/cm^3$, and a 0.5-µm thick p-side contact layer 84 made of GaN doped with Mg at $1\times10^{20}/cm^3$ were sequentially grown on the n-side buffer layer 81. Etching was performed from the p-side contact layer 84 to expose the upper surface of the Si-doped GaN crystal 1000 having a high impurity concentration. An n-side electrode 87 was formed on the exposed upper surface. A light-transmitting p-side electrode 85 was formed on almost the entire surface of the p-side contact layer 84. A pad electrode 86 for bonding was formed on the p-side electrode 85. Finally, the sapphire substrate was polished to a thickness of about 50 µm, and the polished surface was scribed to obtain a 350-µm square LED device.

The output level and electrostatic breakdown voltage of the obtained LED device increased about 1.5 times those of the LED device of Example 18.

EXAMPLE 21

A low-temperature buffer layer made of GaN was grown on a sapphire substrate 11 as in Example 15 to a thickness of 200 angstroms following the same procedure as in Example 15. An undoped GaN layer was grown on the buffer layer to a thickness of 4 µm. Thereafter, first selective growth masks 13 identical to those in Example 15 were formed.

This wafer was transferred to the MOVPE apparatus, and a GaN crystal 16 doped with Si at $1\times10^{18}/cm^3$ was grown to a thickness of 15 µm.

After an n-side cladding layer 81, an active layer 82, a p-side cladding layer 83, and a p-side contact layer 84 were sequentially grown on this GaN crystal 16 as in Example 20, the resultant structure was subjected to the same processing as that in Example 20, thereby obtaining a 350-µm square LED device. This LED device exhibited good characteristics like the LED device of Example 20. In addition, the service life of this LED device became longer than that of the LED device of Example 20.

EXAMPLE 22

A low-temperature buffer layer made of GaN and an undoped GaN layer were grown on an off-angled sapphire substrate 11, and first selective growth masks 13 were formed on the resultant structure in the same manner as in Example 10 except that the stripe width was 10 µm and the stripe interval was 5 µm.

This wafer was transferred to the MOVPE apparatus, and a GaN crystal 16 doped with Si at $1\times10^{19}/cm^3$ was grown on this wafer to a thickness of 10 µm.

After an n-side cladding layer 81, an active layer 82, a p-side cladding layer 83, and a p-side contact layer 84 like those in Example 20 were sequentially grown, and the resultant structure was subjected to the same processing as in Example 20, thereby obtaining a 350-µm square LED device. The output level of this LED device increased about 5% as compared with the LED device of Example 20, and the yield of the device itself was high as in Example 20.

EXAMPLE 22

Three types of Si-doped GaN crystals 16 were grown in the same manner as in Example 14 except that the stripe intervals of the respective types of crystals were set to 5 µm, 3 µm, and 1 µm.

When the number of etching pits was measured in the same manner as in Example 14, the number of etching pits with the stripe intervals being 3 µm and 1 µm was smaller than that with the stripe interval being 5 µm by about 20%.

EXAMPLE 23

This example will be described with reference to FIGS. 1A to 1C, in particular.

A sapphire substrate 11, 2 inches in diameter, having a C plane as a major surface and an ORF surface forming an A plane was set in the MOVPE reaction vessel. A low-temperature buffer layer made of GaN was grown on the substrate at a temperature of 500° C. by using hydrogen gas as a carrier gas and TMG and ammonia as source gases. An undoped GaN layer was then grown on the buffer layer to a thickness of 5 µm at a temperature of 1,050° C., thereby forming an underlayer 12 having a two-layer structure.

The wafer, on which this underlayer 12 was formed, was removed from the MOVPE reaction vessel, and a striped photomask was formed on the upper surface of the underlayer 12. By using a CVD apparatus, 1-µm thick first selective growth masks 13 made up of many $SiO_2$ stripes having a stripe width of 10 µm and a stripe interval of 2 µm were formed on the wafer.

The wafer, on which the selective growth masks 13 were formed, was set in the MOVPE reaction vessel again, and an undoped GaN crystal 16 was grown on the wafer to a thickness of 30 µm at a temperature of 1,050° C. by feeding ammonia at a flow rate of 0.27 mol/min and TMG at a flow rate of 225 micromol/min (V/III ratio=1200). After this growth step, the cross-section of the GaN crystal 16 was observed by a TEM. As a result, it was found that the number of crystal defects in a lower-side region up to a level of about 5 µm from the interface between the crystal 16 and the underlayer 12 was large ($10^8/cm^2$ or more), and a region above this lower-side region had a small number of crystal defects ($10^6/cm^2$ or less) and could be satisfactorily used as a nitride semiconductor crystal substrate. Relatively many crystal defects were present in the portions, of the upper surface of the crystal 16 after the growth step, which correspond to the middle portions of the respective stripe masks and the middle portions of the window portions. However, the number of crystal defects in these portions was smaller than that in the case of V/III ratio of 2,000 or more by 100 times or more.

An n-side buffer layer 211 made of GaN doped with Si at $3\times10^{18}/cm^3$ was grown on the GaN crystal 16 to a thickness of 5 µm by using ammonia as a source gas and silane gas as a dopant gas.

A crack prevention layer 212 made of $In_{0.06}Ga_{0.94}N$ was grown on the n-side buffer layer 211 at a temperature of 800° by using TMG, TMI, and ammonia as source gases.

Subsequently, 25-angstroms thick first layers made of n-type $Al_{0.2}Ga_{0.8}N$ doped with Si at $1\times10^{19}/cm^3$ (using TMA, TMG, ammonia, and silane gas) and 25-angstroms thick second layers made of undoped GaN (using TMG and ammonia) were alternately grown at 1,050° C. to form an n-side cladding layer 213 having a total thickness of 0.3 µm and a superlattice structure.

An n-side light guide layer 214 made of undoped GaN was grown to a thickness of 0.1 µm at 1,050° C.

Subsequently, 40-angstroms thick well layers made of undoped $In_{0.2}Ga_{0.8}N$ and 100-angstroms thick barrier layers made of undoped $In_{0.01}Ga_{0.95}N$ were alternately stacked at a temperature of 800° C. by using TMG, TMI, and ammonia to grow an active layer 215 having a barrier layer as the last layer, a total thickness of 440 angstroms, and a multi quantum well structure.

The temperature was then raised to 1,050° C., and a p-side cap layer 216 made of p-type $Al_{0.3}Ga_{0.7}N$ doped with Mg at $1\times10^{20}/cm^3$ and having a band gap energy higher than that of a p-side light guide layer 217 was grown to a thickness of 300 angstroms by using TMG, TMA, ammonia, and $Cp_2Mg$.

The p-side light guide layer 217 made of undoped GaN and having a band gap energy lower than that of the p-side cap layer 216 was grown to a thickness of 0.1 µm at 1,050° C. by using TMG and ammonia.

Subsequently, 25-angstroms thick first layers made of p-type $Al_{0.2}Ga_{0.8}N$ doped with Mg at $1\times10^{20}/cm^3$ and 25-angstroms thick second layers made of undoped GaN were alternately stacked at 1,050° C. to grow a p-side cladding layer 218 having a total thickness of 0.8 µm and a superlattice structure.

Finally, a p-side contact layer 219 made of p-type GaN doped with Mg at $2\times10^{20}/cm^3$ was grown on the p-side cladding layer 218 to a thickness of 150 angstroms at 1,050° C.

The wafer, on which the nitride semiconductor layers were grown in the above manner, was annealed in a nitrogen atmosphere at 700° C. to further decrease the resistances of the layers doped with a p-type impurity.

After the annealing step, the wafer was removed from the reaction vessel, and the p-side contact layer 219 as the uppermost layer and the p-side cladding layer 218 were etched to provide a ridge having a stripe width of 4 µm by using the RIE apparatus. At this time, ridge stripes were formed in surface regions other than regions at positions corresponding to the middle portions of the stripe masks 13 and the middle portions of the windows in which crystal defects appeared. The formation of ridge stripes at positions where almost no crystal defects are present tends to make it difficult to cause dislocation of crystal defects from the substrate to the active region during laser oscillation. This prolongs the service life of the device and improves the reliability, resulting in an improvement in reliability.

A protective mask was formed on the ridge top surface and etched by RIE to expose the upper surface of the n-side buffer layer 211. This exposed n-side buffer layer 211 also serves as a contact layer for the formation of n-side electrodes 223a and 223b. Note that etching can be performed up to the region, of the GaN crystal 16, in which many crystal defects are present, and the exposed surface can be provided as a contact layer.

A p-side electrode 220 made of Ni and Au was formed, in the form of a stripe, on the top surface of the p-side contact layer 219 forming the ridge. The n-side electrodes 223a and 223b made of Ti and Al were formed, in the form of stripes, on the surface portions, of the n-side buffer layer 211, which were exposed by the above etching.

After this step, an insulating film 221 made of $SiO_2$ was formed on the side surfaces, of the nitride semiconductor layer, which were exposed by the above etching, and a p-pad electrode 222 electrically connected to the p-electrode 220 through the insulating film 221 was formed.

The obtained wafer was transferred to the polishing apparatus to lap the lower surface of the sapphire substrate 11 to a thickness of 70 µm by using a diamond abrasive. Thereafter, the lower surface of the sapphire substrate 11 was polished by 1 µm into a mirror surface by using a finer abrasive. The entire lower surface was metallized with Au/Sn.

After this step, the wafer was scribed on the Au/Sn side to be cleaved in the form of a bar in a direction perpendicular to the striped electrodes, thereby forming a cleavage surface. A dielectric multilayer film made of $SiO_2$ and $TiO_2$ was formed on the resonance surface. Finally, the bar was cut in a direction parallel to the p-electrode to obtain an LD device chip. This chip was placed on the heat sink with the chip facing up, and the respective electrodes were bonded to each other by wire bonding. When this LD device was laser-oscillated at room temperature, continuous oscillation of an oscillation wavelength of 405 nm was observed at a threshold current density of $2.0 kA/cm^2$ and a threshold voltage of 4.0V. The device exhibited a life of 1,000 hrs or more. In addition, 500 LD devices were arbitrarily extracted selected from the LD devices obtained from the above wafer, and the service lives of the 500 LD devices were measured to find that 70% or more of the devices exhibited service lives of 10,000 hrs or more.

The LD devices were manufactured in the same manner as in Example 23 except that the undoped GaNGaN crystals 16 were grown to a thickness of 30 µm by setting the flow rate of ammonia to 0.36 mol/min and the flow rate of TMG to 162 micromol/min (V/III ratio=2222), and the ridge stripes were formed at arbitrary positions. Of the 500 LD devices arbitrarily selected from the obtained LD devices, 5% or less achieved service lives of 10,000 hrs or more.

EXAMPLE 24

LD devices were manufactured by the same method as in Example 23 except that each GaN crystal 16 was grown to a thickness of 10 µm. In this case, the number of crystal defects in the surface of the GaN crystal 16 tended to be larger than that in the LD device of Example 23 on about one order of magnitude. In addition, of 500 LD devices arbitrarily selected from the obtained LD devices, 5% or more achieved service lives of 10,000 hrs or more.

EXAMPLE 25

This example will be described with reference to FIG. 11 mainly.

An Si-doped GaN crystal was grown to a thickness of 30 µm in the same manner as in Example 23 except that the GaN crystal 16 was grown by feeding ammonia at 0.27 mol/min and TMG at 150 micromol/min (V/III ratio=1800) and adding silane gas to these source gases. In this GaN crystal 16, the number of crystal defects in a lower-side region up to a level of about 5 µm from the interface between the crystal 16 and an underlayer 12 was large, and a region above this lower-side region had a small number of crystal defects ($10^6/cm^2$ or less) and could be satisfactorily used as a nitride semiconductor crystal substrate.

Subsequently, nitride semiconductor layers 211 to 219 identical to those in Example 23 were formed. In this case, an LD device was obtained in the same manner as in Example 23 except that a portion of the GaN crystal 16 was removed up to a depth of about 6 μm from the upper surface by etching to expose the GaN crystal 16 in a region having relatively many crystal defects, and n-side electrodes 223a and 223b were formed on the exposed surfaces. Similar to the LD device of Example 23, this LD device continuously oscillated with a low threshold. Of 500 LD devices, 50% or more achieved service lives of 10,000 hrs or more.

EXAMPLE 26

LD devices were manufactured by the same method as in Example 23 except that each GaN crystal 16 was grown by setting the flow rate of ammonia to 0.26 mol/min and the flow rate of TMG to 180 micromol/min (V/III ratio=1500). As a result, almost the same number of LD devices as that in Example 23 could be obtained, which continuously oscillated with a low threshold.

EXAMPLE 27

LD devices were manufactured by the same method as in Example 23 except that in growing each GaN crystal, the flow rate of TMG was increased to set the V/III ratio to 800. As a result, almost the same number of LD devices as that in Example 23 could be obtained, which continuously oscillated with a low threshold.

EXAMPLE 28

LD devices were manufactured by the same method as in Example 23 except that in growing each GaN crystal 16, the flow rate of ammonia was set to 0.15 mol/min and the flow rate of TMG was set to 5 millimol/min (V/III ratio=30). As a result, each LD device continuously oscillated with a low threshold. Of 500 LD devices arbitrarily selected from the obtained LD devices, 30% or more exhibited service lives of 10,000 hrs or more.

EXAMPLE 29

Nitride semiconductor layers 211 to 219 were grown in the same manner as in Example 23 except that in growing a GaN crystal 16, an Si-doped GaN crystal was grown to a thickness of 9 μm by doping the crystal with Si. When the wafer was removed from the reaction vessel, the wafer has warped due to the thermal expansion coefficient difference between a sapphire substrate 11 and the Si-doped GaN crystal. This wafer was polished from the sapphire substrate 11 side to remove the sapphire substrate 11, an underlayer 12, and selective growth masks 13. The obtained GaN crystal in a free state became substantially flat without warpage.

As in Example, 23, the p-side contact layer 219 and the p-side cladding layer 218 were etched in the form of a ridge, and a p-side electrode 220 and an insulating film 221 were formed. Thereafter, a p-pad electrode 222 was formed. In this case, since the selective growth masks 13 were removed, it was difficult to match the position of each ridge stripe with a corresponding window portion by microscopic observation. N-side electrodes 223a and 223b made of Ti/Al were formed on almost the entire exposed lower surface, of the GaN crystal 16, in which many crystal defects were present. Thereafter, this structure was processed in the same manner as in Example 23 to obtain LD devices. These LD devices also continuously oscillated at room temperature with a low threshold. Of arbitrarily selected 500 LD devices, 70% or more exhibited service lives of 10,000 hrs or more.

EXAMPLE 30

This example will be described with reference to FIGS. 1A to 1C and 5A and 5B.

A sapphire substrate 11, 2 inches in diameter, having a C plane as a major surface and an ORF surface forming an A plane was set in the MOVPE reaction vessel, and a low-temperature buffer layer made of GaN was grown on the substrate to a thickness of 200 angstroms at a temperature of 500° C. by using hydrogen gas as a carrier gas and TMG and ammonia as source gases. An undoped GaN layer was grown on the buffer layer to a thickness of 4 μm at a temperature of 1,050° C. to form an underlayer 12 having a two-layer structure.

The wafer, on which this underlayer 12 was formed, was removed from the MOVPE reaction vessel, and a striped photomask was formed on the upper surface of the underlayer 12. Then, 0.5-μm thick first selective growth masks 13 made up of many $SiO_2$ stripes having a stripe width of 10 μm and a stripe interval of 2 μm were formed on the wafer by using the CVD apparatus.

The wafer, on which the selective growth masks 13 were formed, was set in the MOVPE reaction vessel again, and an undoped GaN crystal 16 was grown on the wafer to a thickness of 30 μm at a temperature of 1,050° C. by feeding ammonia at a flow rate of 0.27 mol/min and TMG at a flow rate of 225 micromol/min (V/III ratio=1200). When a GaN crystal is grown while the V/III molar ratio is set to 2,000 or less, the GaN crystal 15 grows laterally on the mask 13 while the grown end face is forming a facet almost perpendicular to the plane of the mask 13. Therefore, the crystal 16 having very few crystal defects can be obtained. The grown GaN crystal (MOVPE GaN crystal) 16 has a uniform surface. When this surface region was observed with a TEM, crystal defects extending from windows 14 stopped halfway in the GaN crystal 16, and almost no crystal defects appeared on the surface.

The wafer, on which the GaN crystal 16 was grown, was transferred to the HVPE apparatus, and an undoped GaN crystal 17 (HVPE GaN crystal) was grown on the wafer to a thickness of 200 μm by using Ga metal, HCl gas, and ammonia as raw materials. When the number of crystal defects in the surface region of the obtained HVPE GaN crystal 17 was measured by two-dimensional TEM observation, it was found that the number of crystal defect was $1 \times 10^4/cm^2$ or less, and hence a GaN crystal having excellent crystallinity was obtained. Very few existing crystal defects were only crystal defects extending in a direction almost parallel to the plane.

The wafer, on which HVPE GaN crystal 17 was grown, was transferred to the polishing apparatus, and the sapphire substrate 11, the underlayer 12, the selective growth masks 13, and the MOVPE GaN crystal 16 were removed by using a diamond abrasive to expose the lower surface of the HVPE GaN crystal 17, thereby obtaining a GaN crystal substrate in a free state which has a total thickness of 195 μm. Note that the number of crystal defects in the lower surface of this crystal substrate was as small as $1 \times 10^5/cm^2$ or less.

EXAMPLE 31

A GaN crystal substrate in a free state was obtained by the same method as in Example 30 except that in growing an HVPE GaN crystal 17, silane gas was added to source gases, GaN was grown first while it was doped with Si at $1\times10^{19}/cm^3$, the flow rate of silane gas was decreased with the growth of GaN, and the GaN crystal was finally grown as GaN doped with Si at $5\times10^{16}/cm^3$, thereby growing 200-μm thick GaN having an Si concentration gradient. In this GaN crystal substrate, the number of crystal defects in the surface with a small amount of Si was almost equal to that in the crystal substrate in Example 3.

EXAMPLE 32

An MOVPE GaN crystal 16 was obtained by the same method as in Example 30 except that in growing the MOVPE GaN crystal 16, silane gas was added to source gases, GaN was grown first while it was doped with Si at $1\times10^{19}/cm^3$, the flow rate of silane gas was decreased with the growth of GaN, and the GaN crystal was finally grown as GaN doped with Si at $1\times10^{17}/cm^3$, thereby growing 20-μm thick GaN having an Si concentration gradient. An Si-doped HVPE GaN crystal 17 was grown to a thickness of 200 μm by the same method as in Example 30 except that in growing the HVPE GaN crystal, GaN was doped with Si at $1\times10^{17}/cm^3$. Thereafter, a sapphire substrate 11, an underlayer 12, and selective growth masks 13 were all removed, and the MOVPE GaN crystal was removed by a thickness of 15 μm.

In the GaN crystal substrate having the two-layer structure made up of the MOVPE GaN crystal and the HVPE GaN crystal obtained in the above manner, the number of crystal defects in the major surface of the HVPE GaN crystal was almost equal to that in the GaN crystal substrate in Example 30, but the number of crystal defects in the lower surface of the MOVPE GaN crystal was larger than that in the major surface of the HVPE GaN crystal by about one order of magnitude.

EXAMPLE 33

This example will be described with reference to FIG. 12.

An n-side contact layer 211 made of GaN doped with Si at $3\times10^{18}/cm^3$ was grown on the upper surface (on the opposite side to the lower surface from which the sapphire substrate 11 and the like were removed by polishing) of an HVPE GaN crystal substrate obtained as in Example 30 to a thickness of 4 μm at 1,050° C. by using ammonia and TMG as source gases and silane gas as an impurity gas.

A crack prevention layer 212 made of $In_{0.06}Ga_{0.94}N$ was grown on the n-side contact layer 211 to a thickness of 0.15 μm at a temperature to 800° C. by using TMG, TMI, and ammonia as source gases.

Subsequently, 25-angstroms thick first layers (using TMA, TMG, and ammonia) made of undoped $Al_{0.16}Ga_{0.84}N$ and 25-angstroms thick second layers (TMG, ammonia, and silane) made of n-type GaN doped with Si at $1\times10^{19}/cm^3$ were alternately grown on the crack prevention layer 212 at 1,050° C. to grow an n-side cladding layer 213 having a total thickness of 1.2 μm and a superlattice structure.

An n-side light guide layer 214 made of undoped GaN was grown on the n-side cladding layer 213 to a thickness of 0.1 μm at 1,050° C. by using TMG ard ammonia.

Subsequently, 100-angstroms thick barrier layers made of undoped $In_{0.01}Ga_{0.95}N$ and 40-angstroms thick well layers made of undoped $In_{0.2}Ga_{0.8}N$ were alternately grown three times at a temperature of 800° C. to grow an active layer 215 having a barrier layer as the last layer, a total thickness of 520 angstroms, and an MQW structure.

The temperature was then raised to 1,050° C. to grow a p-side cap layer 216 made of p-type $Al_{0.3}Ga_{0.7}N$ doped with Mg at $1\times10^{20}/cm^3$ to a thickness of 300 angstroms by using TMG, TMA, ammonia, and $Cp_2Mg$.

A p-side light guide layer 217 made of GaN doped with Mg at $5\times10^{16}/cm^3$ was grown on the p-side cap layer 216 to a thickness of 0.1 μm.

Subsequently, 25-angstroms thick first layers made of undoped $Al_{0.16}Ga_{0.84}N$ and 25-angstroms thick second layers made of GaN doped with Mg at $1\times10^{19}/cm^3$ were alternately grown to grow a p-side cladding layer 218 having a total thickness of 0.6 μm and a superlattice structure.

Finally, a p-side contact layer 219 made of p-type GaN doped with Mg at $1\times10^{20}/cm^3$ was grown to a thickness of 150 angstroms.

The wafer, on which the nitride semiconductor layers were grown in the above manner, was removed from the reaction vessel. An $SiO_2$ protective film was then formed on the upper surface of the p-side contact layer 219 as the uppermost layer, and the wafer was etched by RIE using $SiCl_4$ gas to expose the upper surface, of the n-side contact layer 211, on which an n-side electrode was to be formed.

A mask having a predetermined shape was used for the p-side contact layer 29 as the uppermost layer, and the p-side contact layer 219 and the p-side cladding layer 218 were etched to form a ridge stripe having a width of 1 μm. Thereafter, a $ZrO_2$ insulating film 221 was formed on the side surfaces of the ridge and the exposed surface of the p-side cladding layer 218 such that the top portion of the p-side contact layer 219 was exposed. A p-side electrode 220 electrically connected to the p-side contact layer 219 through the insulating film 221 was formed. An n-side electrode 223 was formed on the surface, of the n-side contact layer 211, which was exposed by etching.

After the GaN crystal substrate 1000 of the wafer obtained in the above manner was thinned by polishing, the GaN crystal substrate 1000 was cleaved to form a resonance surface of an LD device on the cleavage surface. After cleavage, each LD device was separated as a chip, and the lower surface of the GaN crystal substrate 1000 was placed on the heat sink. This LD device exhibited continuous laser oscillation at room temperature at a threshold current density of 1.5 $kA/cm^2$, and a service life of 1,000 hrs or more with an output of 20 mW.

In this example, the LD device was manufactured by using the substrate obtained as in Example 30. However, even in a structure for extracting both n- and p-electrodes from the same surface side, a nitride semiconductor substrate doped with an n-type impurity with a concentration gradient, obtained as in Examples 31 and 32, can be used. In this case, the n-side contact layer 211 is not required, and the n-side electrode 223 can be formed on the surface, of an MOVPE or HVPE crystal with a concentration gradient, which is exposed by etching.

EXAMPLE 34

A crack prevention layer 212, an n-side cladding layer 213, an n-side light guide layer 214, an active layer 215, a p-side cap layer 216, a p-side light guide layer 217, a p-side cladding layer 218, and a p-side contact layer 219 were sequentially grown on the upper surface (on the opposite side to the lower surface from which the sapphire substrate 11 and the like were removed) of an HVPE crystal doped with Si with a concentration gradient, which was obtained as in Example 31, in the same manner as in Example 33 without forming the n-side contact layer 211.

As in Example 33, the p-side contact layer 219 and the p-side cladding layer 218 were etched to form a ridge stripe having a width of 1 μm, an insulating film 221 was formed, and a p-side electrode 220 was formed on the p-side contact layer. An n-side electrode 223 was formed on the lower surface of the GaN crystal substrate. Thereafter, the GaN crystal substrate was polished to a thickness that allows cleavage from the lower surface, and the substrate was cleaved in the same manner as in Example 33, thereby obtaining an LD device. In this example, even if the GaN crystal substrate was polished, since a concentration gradient was set, the exposed surface of the nitride semiconductor substrate was always a surface heavily doped with an n-type impurity. The obtained LD device had substantially the same characteristics as those of Example 33.

EXAMPLE 35

This example will be described with reference to FIGS. 7A to 7D.

A sapphire substrate 11 having a C plane as a major surface and an ORF surface as an A plane was set in the MOVPE reaction vessel. A low-temperature buffer layer 12 made of GaN was then grown on the sapphire substrate 11 to a thickness of about 200 angstroms at a temperature of 510° C. by using hydrogen as a carrier gas and ammonia and TMG as source gases. A GaN layer 71 doped with Si at $1\times10^{18}/cm^3$ was grown on the underlayer 12 to a thickness of 2 μm at a temperature of 1,050° C. by using TMG and ammonia as source gases.

After this step, a striped photomask was formed on the GaN layer 71, and 1-μm thick silicon dioxide stripes having a stripe width of 15 μm and a stripe interval of 3 μm were formed by using the sputtering apparatus. The GaN layer 71 was etched halfway to form grooves 72 by using the RIE apparatus. The GaN layer 71 was exposed only at the side surfaces and bottom surfaces of the grooves 72. Note that each silicon dioxide stripes extended in a direction perpendicular to the ORF surface of the sapphire substrate 11.

After the grooves 72 were formed in this manner, a second silicon dioxide layer was formed on the entire surface of the resultant structure, including the first silicon dioxide masks and the side and bottom surfaces of the grooves 72. Thereafter, only the portions, of the second silicon dioxide layer, which were located above the side surfaces of the grooves 72 were etched, except for the portions above the bottom surfaces of the grooves 72 and the silicon dioxide stripes, by using a gas mixture of $CF_4$ and $O_2$ gases. As a result, first growth control masks 73 made of the first and second silicon dioxides were formed the walls between the adjacent grooves 72, and second growth control masks 74 made of the second silicon dioxide were formed on the bottom portions of the grooves 73.

The wafer, on which the GaN layer 71, the grooves 72, and the first and second growth control masks 73 and 74 were formed, was set in the MOVPE reaction vessel. A GaN crystal 76 doped with Si at $1\times10^{18}/cm^3$ was grown on the wafer to a thickness of 30 μm at 1,050° C. by using TMG and ammonia as source gases and silane gas as a dopant gas.

The wafer, on which the Si-doped GaN crystal 76 was grown, was removed from the reaction vessel.

For comparison, the buffer layer 12 was grown on the sapphire substrate 11, and the GaN layer 71 was grown on the buffer layer to a thickness of 30 μm to obtain a comparative GaN substrate.

When the numbers of crystal defects in the two GaN substrates were measured by two-dimensional TEM observation, it was found that the number of crystal defects in the GaN substrate in Example 35 was $6\times10^6/cm^2$, whereas that in the comparative GaN substrate was $1\times10^{10}/cm^2$.

EXAMPLE 36

An underlayer 12 and an Si-doped GaN layer 71 were grown on a sapphire substrate 11 by the same method as in Example 35. Grooves 72 similar to those in Example 35 were formed in the GaN layer 71 by dicing. A silicon dioxide layer was formed on the entire surface of the resultant structure. Only the portions, of the silicon dioxide layer, which were located on the side surfaces of the grooves 72 were removed by etching to form first growth control masks 73 covering the top surfaces of the walls between the grooves 72 and second growth control masks 74 covering the bottom portions of the grooves 72. The GaN layer 71 was exposed only at the side surfaces of the grooves 72. An Si-doped GaN crystal 76 was grown on this wafer by the same method as in Example 35. When the number of crystal defects in the obtained GaN crystal substrate 76 was measured, a good result was obtained as in Example 35.

EXAMPLE 37

An Si-doped GaN crystal 76 was grown by the same method as in Example 35 except that a GaN layer 71 was etched up to a sapphire substrate 11. This GaN crystal had few crystal defects like the crystal in Example 35.

EXAMPLE 38

This example will be described with reference to FIGS. 8A and 8C.

An Si-doped GaN crystal 76 was grown to a thickness of 200 μm by the same method as in Example 35. A sapphire substrate 11, an underlayer 12, a GaN layer 71, and growth control masks 73 and 74 were removed from this wafer by polishing to obtain an Si-doped GaN crystal substrate in a free state.

This Si-doped GaN crystal substrate (substrate 1000) was set in the MOVPE reaction vessel of the MOVPE apparatus, and a high-temperature buffer layer 81 made of GaN doped with Si at $1\times10^{18}/cm^3$ was grown on the upper surface of the substrate at 1,050° C.

Subsequently, a 20-angstroms thick $In_{0.4}Ga_{0.6}N$ active layer 82 having a single quantum well structure, a 0.3-angstroms thick p-side cladding layer 83 made of $Al_{0.2}Ga_{0.8}N$ doped with Mg at $1\times10^{20}/cm^3$, and a 0.5-μm thick p-side contact layer 84 made of GaN doped with Mg at $1\times10^{20}/cm^3$ were sequentially grown on this high-temperature buffer layer 81.

The wafer, on which the nitride semiconductor layers were formed in this manner, was removed from the reaction vessel and was annealed in a nitrogen atmosphere at 600° C. to decrease the resistances of the p-side cladding layer 83 and the p-side contact layer 84. Thereafter, etching was performed form the p-side contact layer 84 side to expose the upper surface of the GaN crystal substrate 1000.

After the etching step, a 200-angstroms thick light-transmitting p-electrode 85 made of Ni/Au was formed on almost the entire upper surface of the p-side contact layer 84. A 0.5-μm thick pad electrode 86 for bonding was formed on the p-electrode 35.

Subsequently, a 0.5-μm thick n-side electrode 87 was formed on the entire lower surface of the GaN crystal substrate 1000.

The obtained wafer was scribed from the n-electrode 87 side to cleave the M plane ((1$\bar{1}$00) plane) of the GaN substrate 1000 along a surface perpendicular to the M plane, thereby obtaining a 300-μm square LED chip. This LED emitted 520-nm green light with 20 mA. The output level and electrostatic breakdown voltage of the LED were twice or more those of a device obtained by growing a nitride semiconductor device structure on a conventional sapphire substrate. That is, this device exhibited excellent characteristics.

EXAMPLE 39

This example will be described with reference to FIG. 10.

An Si-doped GaN crystal 76 was grown to a thickness of 200 μm by the same method as in Example 35. A sapphire substrate 11, an underlayer 12, a GaN layer 71, and growth control masks 73 and 74 were removed from this wafer by polishing to obtain an Si-doped GaN crystal substrate in a free state.

This Si-doped GaN crystal substrate (substrate 1000) was set in the MOVPE reaction vessel of the MOVPE apparatus. A total of 100 20-angstroms thick first layers made of n-type $Al_{0.2}Ga_{0.8}N$ doped with Si at $1\times10^{19}/cm^3$ and 20-angstroms thick second layers made of undoped GaN were alternately grown on the upper surface of the Si-doped GaN crystal substrate 1000 without forming a buffer layer 211 and a crack prevention layer 212 to form an n-side cladding layer 213 having a total thickness of 0.4 μm and a superlattice structure.

An n-side light guide layer 214 made of n-type GaN doped with Si at $1\times10^{17}/cm^3$ was grown on the n-side cladding layer 213 to a thickness of 0.1 μm.

Subsequently, 25-angstroms thick well layers made of $In_{0.2}Ga_{0.8}N$ doped with Si at $1\times10^{17}/cm^3$ and 50-angstroms thick barrier layers made of $In_{0.01}Ga_{0.95}N$ doped with Si at $1\times10^{17}/cm^3$ were alternately grown to form an active layer 215 having a total thickness of 175 angstroms and a multi quantum well (MQW) structure.

A p-side cap layer 216 made of p-type $Al_{0.3}Ga_{0.9}N$ doped with Mg at $1\times10^{20}/cm^3$ and having a band gap energy higher than that of a p-side light guide layer 217 and that of the active layer 215 was grown to a thickness of 300 angstroms.

The p-side light guide layer 217 made of p-type GaN doped with Mg at $1\times10^{18}/cm^3$ and having a band gap energy lower than that of the p-side cap layer 216 was grown to a thickness of 0.1 μm.

After this step, 20-angstroms thick first layers made of p-type $Al_{0.2}Ga_{0.8}N$ doped with Mg at $1\times10^{20}/cm^3$ and 20-angstroms thick second layers made of p-type GaN doped with Mg at $1\times10^{20}/cm^3$ were alternately grown to form a p-side cladding layer 218 having a total thickness of 0.4 μm and a superlattice structure.

Finally, a p-side contact layer 219 made of p-type GaN doped with Mg at $2\times10^{20}/cm^3$ was grown to a thickness of 150 angstroms.

The wafer, on which the nitride semiconductor layers were formed, was annealed in a nitrogen atmosphere at 700° C. to decrease the resistance of each p-side layer in the reaction vessel. After the annealing step, the wafer was removed from the reaction vessel, and the p-side contact layer 219 as the uppermost layer and the p-side cladding layer 218 were etched by the RIE apparatus to obtain a ridge having a stripe with of 4 μm. A p-side electrode 220 made of Ni/Au was then formed on the entire top surface of the ridge. An $SiO_2$ insulating film 221 was formed on the exposed surfaces of a p-side cladding layer 48 and a contact layer 49 except for the p-electrode 220. A pad electrode 222 electrically connected to the p-electrode 220 through this insulating film 221 was formed.

After this step, a 0.5-μm thick n-side electrode 223 made of Ti/Al was formed on the entire lower surface of the GaN crystal substrate 1000. A thin film made of Au/Sn and used for metallization for a heat sink was formed on the n-side electrode 223.

Subsequently, the wafer was scribed from the n-electrode 223 to cleave the GaN substrate 1000 in the form of a bar along the M plane ((1$\bar{1}$00) plane) of the GaN crystal 1000 (the plane corresponding to a side surface of the hexagonal prism in FIG. 3) so as to form resonance surfaces. A dielectric multilayer film made of $SiO_2$ and $TiO_2$ was formed on both or one of the resonance surfaces. Finally, the bar was cut in a direction parallel to the p-electrode to obtain a laser chip. The chip was then placed on a heat sink with the chip facing up (in a state wherein the substrate opposes the heat sink), and the pad electrode 222 was subjected to wire bonding. When the resultant LD device was laser-oscillated at room temperature, continuous oscillation of an oscillation wavelength of 405 nm was observed at a threshold current density of 2.0 $kA/cm^2$ and a threshold voltage of 4.0V. This device exhibited a service life of 1,000 hrs or more.

EXAMPLE 40

This example will be described with reference to FIG. 8.

An undoped GaN crystal 76 was grown by the same method as in Example 35 except for the GaN crystal was grown without doping it with Si. This GaN crystal 76 (substrate 1000) was used to manufacture the following device structure while the crystal was supported on a sapphire substrate 11.

A total of 100 20-angstroms thick first layers made of n-type $Al_{0.2}Ga_{0.8}N$ doped with Si at $1\times10^{19}/cm^3$ and 20-angstroms thick second layers made of undoped GaN were alternately grown on the substrate 1000 to form an n-side cladding layer 81 having a total thickness of 0.4 μm and a superlattice structure.

A 20-angstroms thick $In_{0.4}Ga_{0.6}N$ active layer 82 having a single quantum well structure, a 0.3-μm thick p-side cladding layer 83 made of $Al_{0.2}Ga_{0.8}N$ doped with Mg at $1\times10^{20}/cm^3$, and a 0.5-μm thick p-side contact layer 84 made of GaN doped with Mg at $1\times10^{20}/cm^3$ were sequentially grown on the n-side cladding layer 81. Etching was then performed from the p-side contact layer 84 to expose the upper surface of the n-side cladding layer 81. An n-side electrode 87 was formed on the exposed upper surface. A light-transmitting p-side electrode 85 was formed on almost the entire surface of the p-side contact layer 84. A pad electrode 86 for bonding was formed on the electrode 85. Finally, the lower surface of the sapphire substrate was polished to a thickness of about 50 μm, and the polished surface was scribed to obtain a 350-μm square device.

The output level and the electrostatic breakdown voltage of the obtained LED device increased about 1.5 times those of the LED device of Example 38.

The invention claimed is:

1. A nitride semiconductor device comprising:
a nitride semiconductor substrate having a first surface and second surface;
a nitride semiconductor structure having an indium-containing active layer, the nitride semiconductor structure having been grown on the first surface of the nitride semiconductor substrate; and
an n-side electrode formed on the second surface of the nitride semiconductor substrate
wherein the number of crystal defects in the nitride semiconductor substrate is less than $1 \times 10^5/cm^2$.

2. The nitride semiconductor device according to claim 1, further comprising a buffer layer in contact with the nitride semiconductor substrate, the buffer layer being a distorted superlattice structure formed by alternately stacking first and second nitride semiconductor layers having different compositions.

3. The nitride semiconductor device according to claim 2, wherein the buffer layer is operable as an n-side cladding layer serving as a carrier confining layer.

4. The nitride semiconductor device according to claim 3, wherein the n-side cladding layer is formed by alternately stacking an aluminum-containing nitride semiconductor doped with an n-type impurity and undoped GaN layers.

5. The nitride semiconductor device according to claim 1, wherein the nitride semiconductor substrate is doped with an n-type impurity.

6. The nitride semiconductor device according to claim 1, wherein the n-side electrode is made of a metal selected from the group consisting of Al, Ti, W, Cu, Zn, Sn, In, a multilayer thereof, and an alloy thereof.

7. The nitride semiconductor device according to claim 1, wherein the n-side electrode is formed on substantially the entire second surface of the nitride semiconductor substrate.

8. The nitride semiconductor device according to claim 1, wherein the nitride semiconductor device is a light-emitting diode or laser diode device having the n-side electrode provided on the back surface of the nitride semiconductor substrate.

9. The nitride semiconductor device according to claim 1, wherein a n-side electrode having a two-layer structure made of Ti/Al is formed on the nitride semiconductor substrate.

10. The nitride semiconductor device according to claim 1, wherein the nitride semiconductor substrate is grown by a halide vapor-phase epitaxial growth method.

11. The nitride semiconductor device according to claim 1, wherein the nitride semiconductor substrate is doped with an n-type impurity such that the n-type impurity concentration has a gradient, wherein the gradient from said first surface to said surface is from lesser concentration to greater concentration.

12. The nitride semiconductor device according to claim 11, wherein the concentration gradient is continuous or stepwise.

13. The nitride semiconductor device according to claim 11, wherein the n-type impurity is one element selected from the group consisting of Si, Ge, Sn, and S.

14. The nitride semiconductor device according to claim 1, wherein the nitride semiconductor substrate is an epitaxial substrate.

15. The nitride semiconductor device according to claim 14, wherein the device is a light-emitting diode device having a bonding pad formed on substantially the central portion of the top surface of the nitride semiconductor structure.

16. The nitride semiconductor device according to claim 14, wherein the device is a light-emitting diode device, and the side surfaces of the nitride semiconductor structure are exposed over at least part of the nitride semiconductor substrate.

17. The nitride semiconductor device according to claim 14, wherein the device is a laser diode device in which the nitride semiconductor structure forms a ridge.

18. The nitride semiconductor device according to claim 17, wherein the device is a laser diode device having insulating film formed on the nitride semiconductor structure covering at least part of the ridge except for a p-side electrode.

19. The nitride semiconductor device according to claim 18, further comprising a p-side pad formed on the insulating film over the ridge.

20. A nitride semiconductor device comprising:
a nitride semiconductor substrate having a first surface and second surface;
a nitride semiconductor structure having an indium-containing active layer, the nitride semiconductor structure having been grown on the first surface of the nitride semiconductor substrate;
an n-side electrode formed on the second surface of the nitride semiconductor substrate; and
a buffer layer in contact with the nitride semiconductor substrate, the buffer layer being a distorted superlattice structure formed by alternately stacking first and second nitride semiconductor layers having different compositions.

21. A nitride semiconductor device comprising:
a nitride semiconductor substrate having a first surface and second surface;
a nitride semiconductor structure having an indium-containing active layer, the nitride semiconductor structure having been grown on the first surface of the nitride semiconductor substrate; and
an n-side electrode formed on the second surface of the nitride semiconductor substrate, wherein the nitride semiconductor substrate is doped with an n-type impurity such that the n-type impurity concentration has a gradient, wherein the gradient from said first surface to said surface is from lesser concentration to greater concentration.

* * * * *